(12) United States Patent
Kitamura et al.

(10) Patent No.: US 6,444,262 B1
(45) Date of Patent: Sep. 3, 2002

(54) THERMAL PROCESSING UNIT AND THERMAL PROCESSING METHOD

(75) Inventors: Masayuki Kitamura, Hachioji; Tomohiro Shiotani, Sagamihara; Isao Tafusa, Yokohama, all of (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/548,603

(22) Filed: Apr. 13, 2000

(30) Foreign Application Priority Data

Apr. 14, 1999 (JP) .......................................... 11-107304

(51) Int. Cl.[7] .............................................. C23C 16/00
(52) U.S. Cl. ..................... 427/248.1; 118/715; 118/719
(58) Field of Search ................................. 118/715, 725, 118/728, 729, 500; 427/248.1

(56) References Cited

U.S. PATENT DOCUMENTS

| 5,482,559 A | * | 1/1996 | Imai | ............................ 118/728 |
| 5,494,524 A | * | 2/1996 | Inaba | ........................ 118/728 |
| 5,902,103 A | * | 5/1999 | Maeda | ........................ 432/253 |

FOREIGN PATENT DOCUMENTS

| EP | 0 164 928 A2 | 5/1985 | | |
| JP | 61-2321 | 1/1986 | | |
| JP | 62-160537 | 10/1987 | | |
| JP | 1-109714 | 4/1989 | | |
| JP | 1-220434 | 9/1989 | | |
| JP | 1-228123 | * | 9/1989 | ................. 118/722 |
| JP | 2-91931 | 3/1990 | | |
| JP | 3-122532 | 12/1991 | | |
| JP | 4-139820 | 5/1992 | | |
| JP | 5-251391 | 9/1993 | | |
| JP | 7-22319 | 1/1995 | | |
| JP | 10-335253 | 12/1998 | | |

* cited by examiner

*Primary Examiner*—Richard Bueker
(74) *Attorney, Agent, or Firm*—Smith, Gambrell & Russell, LLP

(57) ABSTRACT

A thermal processing unit of the invention includes a substrate-holder which can support a plurality of substrates in such a manner that the plurality of substrates are arranged at a predetermined pitch, and a chamber vessel for housing the substrate-holder. The inside of the chamber vessel may be made a vacuum. A gas-introducing slit having a small conductance is provided in one part of a peripheral area of the plurality of substrates held by the substrate-holder. The gas-introducing slit extends in a direction in which the plurality of substrates are arranged and supplies a processing gas for a thermal process into the chamber vessel. A gas-absorbing opening having a large conductance is provided in another part of the peripheral area of the plurality of substrates held by the substrate-holder. The gas-absorbing opening extends in the direction in which the plurality of substrates are arranged. The substrate-holder may be loaded into and unloaded out of the chamber vessel by a loading mechanism.

17 Claims, 19 Drawing Sheets

START OF INTRODUCING SiH₄

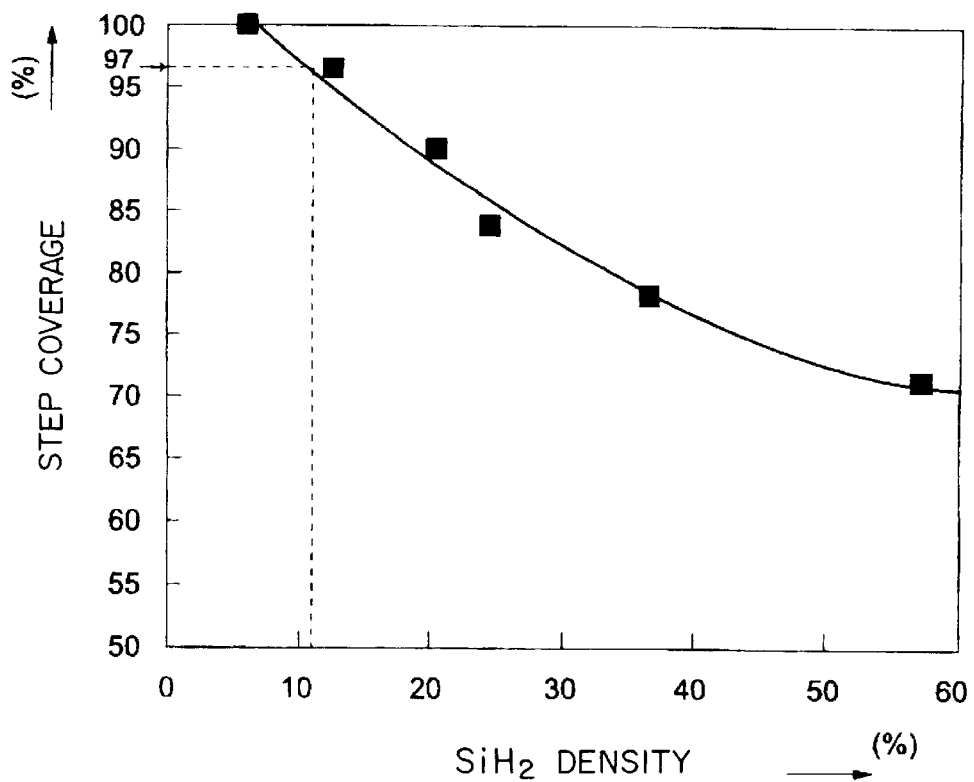
F I G. 10

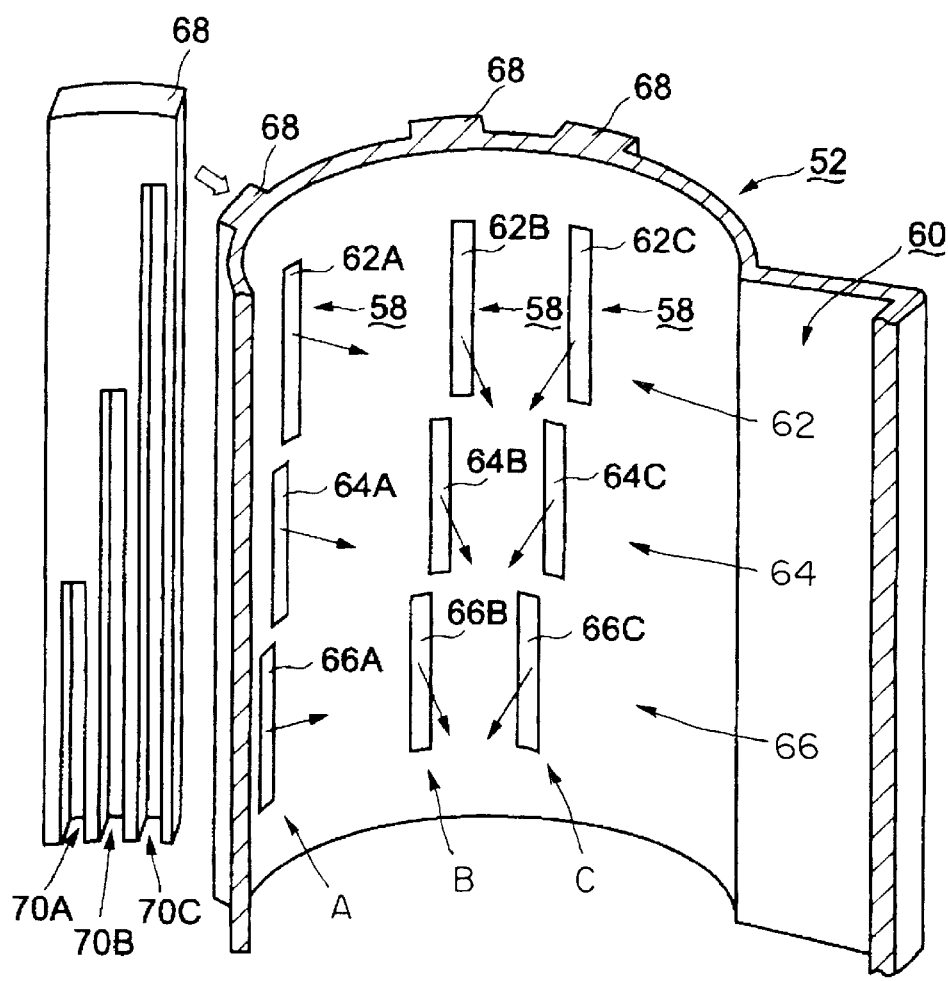
F I G. 15

THERMAL PROCESSING UNIT AND THERMAL PROCESSING METHOD

BACKGROUND OF THE INVENTION

1. Field of the Invention

This invention relates to a thermal processing unit and a thermal processing method, such as a film-forming processing unit and a film-forming processing method, for an object to be processed such as a semiconductor wafer.

2. Disclosure of the Prior Art

In general, a batch-type of thermal processing unit is mainly used for various thermal processes, for example a film-forming process, to a semiconductor wafer or the like because the batch-type of thermal processing unit can conduct a thermal process to many semiconductor wafers at a time.

In the thermal processing unit, about 70 to 150 semiconductor wafers are supported at a predetermined pitch by a wafer-boat made of quartz. The wafer-boat is housed in a longitudinal cylindrical processing chamber. A processing gas flows upward or downward in the processing chamber. Thus, a predetermined thermal process such as a film-forming process can be conducted to the many semiconductor wafers.

A typical batch-type of thermal processing unit is explained below.

FIG. 21 is a schematic view of a common batch-type of thermal processing unit. As shown in FIG. 21, the batch-type of thermal processing unit 102 includes a processing chamber vessel 108 which has an inside cylinder 104 and an outside cylinder 106. A wafer-boat 110 is housed in a processing space S defined in the inside cylinder 104. The wafer-boat 110 can be inserted into and discharged from the processing space S through a bottom opening of the inside cylinder 104. Many, for example about 150 product wafers W are placed on the wafer-boat 110 at a predetermined pitch. Then, a predetermined thermal process such as CVD (Chemical Vapor Deposition) is conducted to the wafers W.

A processing gas such as a film-forming gas can be introduced into the processing chamber vessel 108 through a lower portion thereof. Then, the processing gas flows upward in the processing space S of the inside cylinder 104, where is a high temperature area, while reacting with the wafers W. After that, the processing gas turns down and flows downward between the inside cylinder 104 and the outside cylinder 106. Then, the processing gas is discharged outside from an exhaust opening 112. Heaters not shown are arranged at respective zones in a surrounding area of the processing chamber vessel. During the thermal process, the semiconductor wafers W are maintained at a processing temperature, and an inside of the processing chamber vessel is maintained at a processing pressure.

The processing gas introduced into the processing chamber vessel flows upward in a surrounding area of the wafers in a direction in which the wafers are arranged (a vertical direction in FIG. 21). A part of the processing gas flows between neighboring two wafers and reacts with the two wafers by a thermal decomposition. Thus, films can be deposited on the wafers.

In the case of the film-forming process, in order to improve the productivity, it is desired that fine quality films can be formed on wafers at a high film-forming rate, with a high level of film-thickness uniformity within a wafer and with a high level of film-thickness uniformity in wafer to wafer.

In order to raise film-forming rates for various films, it is effective to promote the reactions of the processing gases by raising parameters such as amounts (flow rates) of the supplied processing gases, processing pressures, processing temperatures or the like. However, in order to obtain fine quality films, the above parameters can not be raised over respective limitations. For example, when $SiH_4$ gas is used as a processing gas to form a poly-Si film on a wafer, the film can not have a fine quality if the processing pressure is higher than 1.5 Torr. The reason is that decomposing reactions in the gas phase are promoted too much since the time for which the $SiH_4$ gas passes through the hot processing space S becomes long if the processing pressure is higher than 1.5 Torr.

If the reactions in the gas phase are promoted too much, powdery Si deposits on the wafer to deteriorate the quality of the film. In addition, the powdery Si may turn into particles. Thus, the processing pressure has to be not higher than 1.5 Torr to conduct a fine film-forming process wherein reactions in the gas phase are restrained but decomposing reactions are promoted on the wafer i.e. surface-reactions a remain. Thus, the maximum of the film-forming rate is about 15 Å/min.

This invention is intended to solve the above problems effectively. The object of this invention is to provide a thermal processing unit and a thermal processing method that can not deteriorate a quality of a thermal process but raise a thermal processing rate such as a film-forming rate.

SUMMARY OF THE INVENTION

The inventor of the invention has found the following matters. When a processing gas is forcibly caused to pass between neighboring two of a tier-like plurality of semiconductor wafers, the time for which the processing gas passes between them becomes short and reactions in the gas phase are restrained. Thus, even when the processing pressure is high, the reactions in the gas phase can be restrained and the film-forming rate can be raised. Then, this invention has been gotten in shape.

This invention is characterized by a feature wherein a thermal processing unit comprises: a substrate-holder which can support a plurality of substrates in such a manner that the plurality of substrates are arranged at a predetermined pitch; a chamber vessel for housing the substrate-holder, said chamber vessel having an inside being made a vacuum; a gas-introducing slit having a small conductance provided in one part of a peripheral area of the plurality of substrates held by the substrate-holder, said gas-introducing slit extending in a direction in which the plurality of substrates are arranged and supplying a processing gas for a thermal process into the chamber vessel; a gas-absorbing opening having a large conductance provided in another part of the peripheral area of the plurality of substrates held by the substrate-holder, said gas-absorbing opening extending in the direction in which the plurality of substrates are arranged; and a loading mechanism for loading and unloading the substrate-holder into and out of the chamber vessel.

According to the feature, the processing gas is forcibly caused to pass between the substrates because the processing gas flows from the gas-introducing slit having the small conductance to the gas-absorbing opening having the large conductance. Then, the staying time for which the processing gas passes and stays between the substrates becomes short. Thus, when the thermal process is a film-forming process, even when the processing pressure is high, reactions in the gas phase are so restrained that film-forming reactions by surface-reactions are main, i.e., the film-forming process can be conducted at a high film-forming rate.

Preferably, the chamber vessel has an inside cylinder for housing the substrate-holder and an outside cylinder surrounding the inside cylinder, and the gas-introducing slit and the gas-absorbing opening are formed in the inside cylinder.

Preferably, the gas-introducing slit is formed along one part of a side wall of the chamber vessel, and the gas-absorbing opening is formed by outward denting another part of the side wall of the chamber vessel.

Preferably, the gas-introducing slit is divided into a plurality of zone-slits which respectively correspond to a plurality of zones divided in the direction in which the plurality of substrates are arranged.

According to the feature, the processing gas can be supplied substantially uniformly through the plurality of zone-slits which respectively correspond to the plurality of zones divided in the direction in which the plurality of substrates are arranged.

In the case, preferably, the plurality of zone-slits are respectively connected to a plurality of flow-controllers which respectively correspond to the plurality of zones.

Preferably, each of the plurality of zone-slits is divided into a plurality of slit-elements which respectively correspond to a plurality of peripheral areas of the plurality of substrates.

According to the feature, the processing gas can be supplied substantially uniformly in each of the plurality of substrates.

Preferably, the substrate-holder has board-members coming in contact with portions of peripheries of the plurality of substrates on both sides of the gas-absorbing opening, said board-members having arc sections and predetermined thicknesses extending from the portions of peripheries of the plurality of substrates in a radial direction of the plurality of substrates respectively.

According to the feature, the board-members can function as baffle plates to prevent the processing gas from flowing outside of the substrates and to guide the processing gas between the substrates. Thus, for example, the film-forming rate can be raised even when the volume of the supplied processing gas is small.

In addition, this invention is characterized by a feature wherein a thermal processing method comprises: a step of supporting a plurality of substrates in such a manner that the plurality of substrates are arranged at a predetermined pitch; and a step of supplying a processing gas for a thermal process from a gas-introducing slit to a gas-absorbing opening and causing the processing gas to pass between any neighboring two of the plurality of substrates, said gas-introducing slit having a small conductance provided in one part of a peripheral area of the plurality of substrates, and extending in a direction in which the plurality of substrates are arranged, said gas-absorbing opening having a large conductance provided in another part of the peripheral area of the plurality of substrates, and extending in the direction in which the plurality of substrates are arranged.

Preferably, the gas-introducing slit is divided into a plurality of zone-slits which respectively correspond to a plurality of zones divided in the direction in which the plurality of substrates are arranged.

Preferably, a volume of the processing gas for the thermal process supplied into each of the plurality of zone-slits is controlled independently.

Preferably, the volume of the processing gas for the thermal process supplied into each of the plurality of zone-slits is controlled in such a manner that the volume is larger when a zone-slit is nearer to a discharging opening connected to the gas-absorbing opening.

In addition, this invention is characterized by a feature a film-forming processing method comprises: a step of supporting a plurality of substrates in such a manner that the plurality of substrates are arranged at a predetermined pitch; and a step of supplying a processing gas for a film-forming process from a gas-introducing slit to a gas-absorbing opening and causing the processing gas to pass between any neighboring two of the plurality of substrates, said gas-introducing slit having a small conductance provided in one part of a peripheral area of the plurality of substrates, and extending in a direction in which the plurality of substrates are arranged, said gas-absorbing opening having a large conductance provided in another part of the peripheral area of the plurality of substrates, and extending in the direction in which the plurality of substrates are arranged.

Preferably, the gas-introducing slit is divided into a plurality of zone-slits which respectively correspond to a plurality of zones divided in the direction in which the plurality of substrates are arranged.

Preferably, a volume of the processing gas for the film-forming process supplied into each of the plurality of zone-slits is controlled independently.

Preferably, the volume of the processing gas for the film-forming process supplied into each of the plurality of zone-slits is controlled in such a manner that the volume is larger when a zone-slit is nearer to a discharging opening connected to the gas-absorbing opening.

BRIEF DESCRIPTION OF THE DRAWINGS

FIG. 10 is a graph showing a relationship between $SiH_2$ densities and step coverages;

FIG. 15 is a partial sectional perspective view of the processing chamber vessel;

DESCRIPTION OF THE PREFERRED EMBODIMENT

Embodiments of the invention will now be described in more detail with reference to FIGS. 1 to 20.

Figure 1:
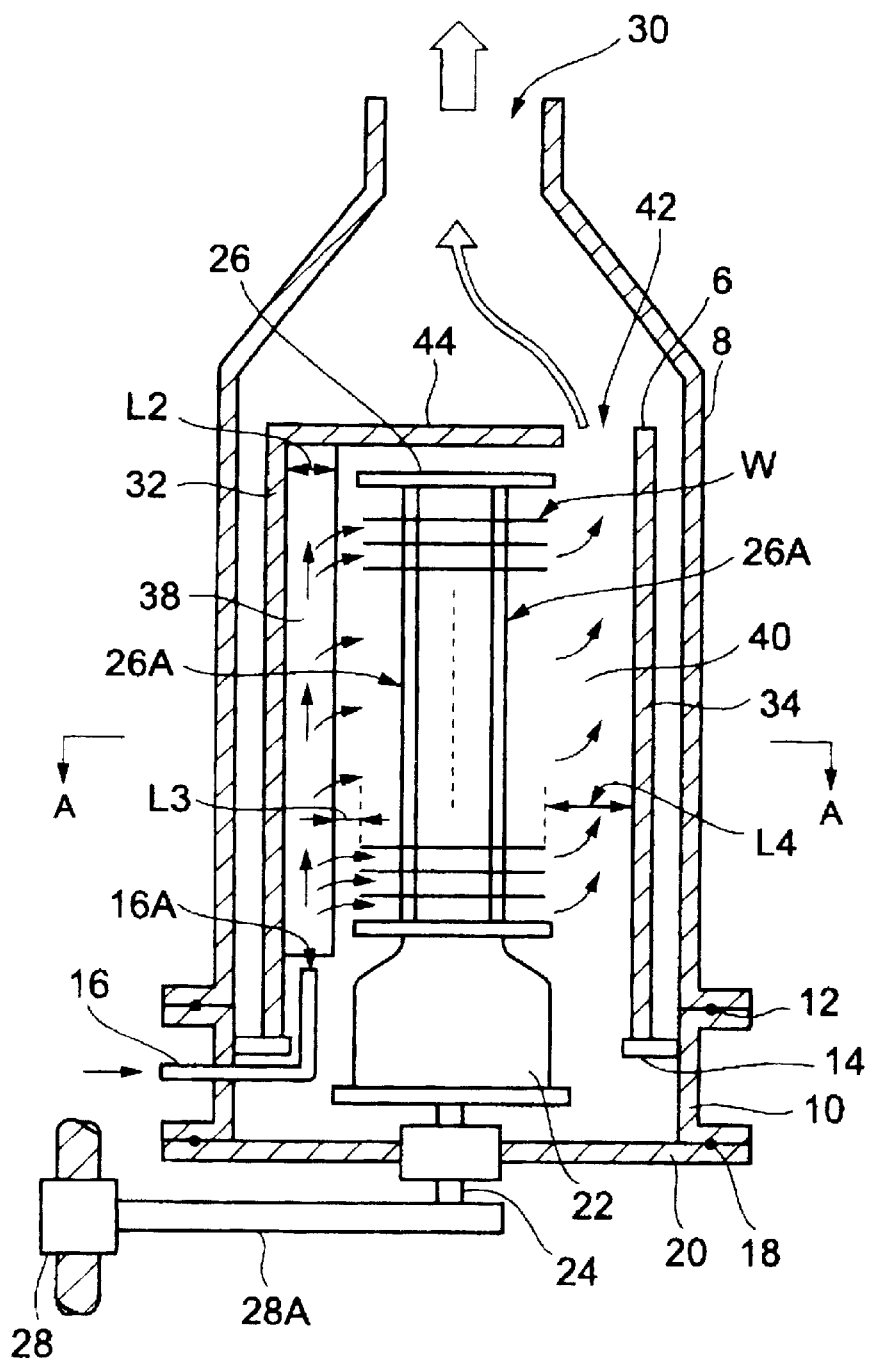
FIG. 1 is a schematic longitudinal sectional view of a first embodiment of the thermal processing unit according to the invention.
Figure 2:
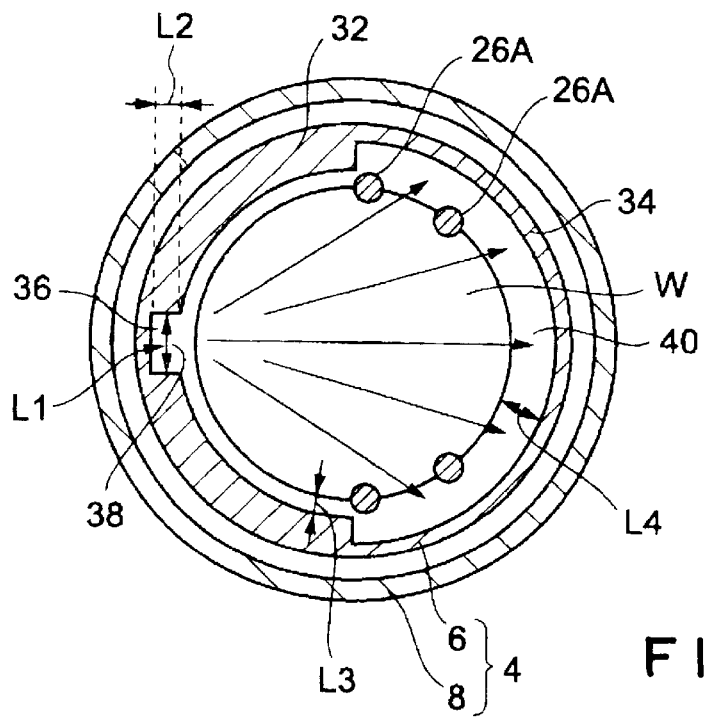
FIG. 2 is a schematic transverse sectional view taken along A—A line of FIG. 1.
Figure 3:
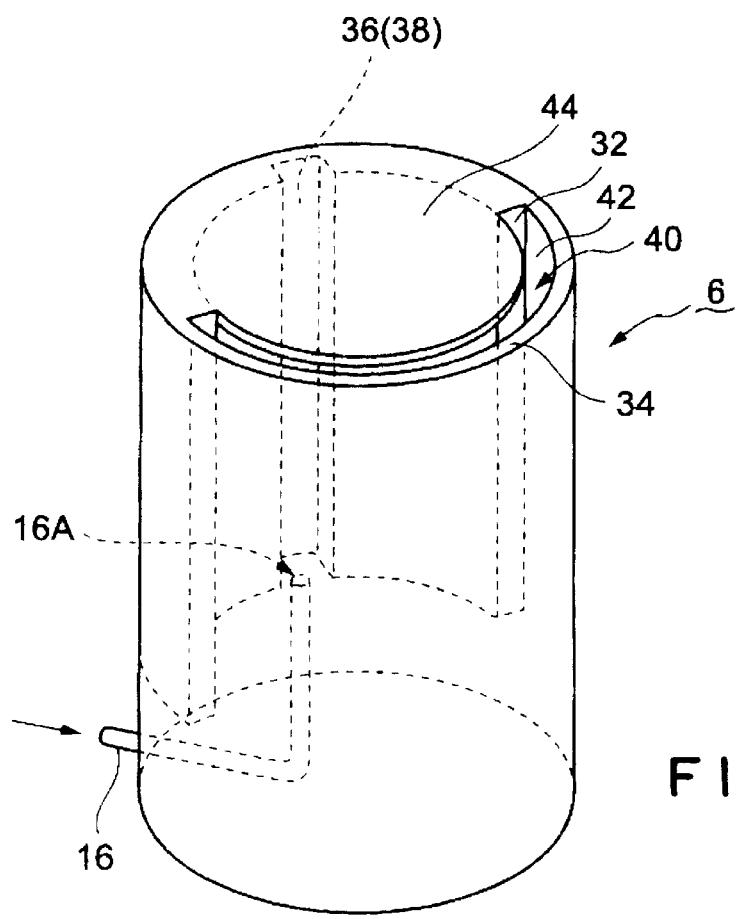
FIG. 3 is a schematic perspective view of the inside cylinder of FIG. 1.

FIG. 1 is a schematic longitudinal sectional view of a first embodiment of the thermal processing unit according to the invention. FIG. 2 is a schematic transverse sectional view taken along A—A line of FIG. 1. FIG. 3 is a schematic perspective view of the inside cylinder of FIG. 1. In the case, a film-forming process wherein Si film is deposited is explained as an example of thermal process.

As shown in FIGS. 1 to 3, a thermal processing unit 2 includes a cylindrical processing chamber vessel 4, which is for example made of crystal. The processing chamber vessel 4 mainly consists of an inside cylinder 6 and an outside cylinder 8 surrounding the inside cylinder 6. Heaters not shown are arranged around the processing chamber vessel 4. A lower end of the outside cylinder 8 is hermetically joined to a manifold 10, which is for example made of stainless steel, via a sealing member 12 such as an O ring. A lower end of the inside cylinder 6 is placed on and supported by a circular supporting portion 14, which projects inward from the manifold 10.

A gas-introducing nozzle 16, which is bent to have an L-like shape, pierces through the manifold 10. The gas-introducing nozzle 16 is adapted to introduce a processing gas, for example a film-forming gas such as $SiH_4$ gas, $Si_2H_6$ gas, $B_2H_6$. gas, $AsH_3$ gas or the like, or another necessary gas.

A cap 20 is hermetically and removably attached to a lower opening of the manifold 10 via a sealing member 18 such as an O ring. A rotating shaft 24 pierces through a center of the cap 20. A thermal tube 22 made of crystal is supported on an upper end of the rotating shaft 24. A wafer-boat 26 is placed on the thermal tube 22 as a substrate holder. The wafer-boat 26 is made of crystal and has plural columns 26A. Many tier-like supporting grooves not shown are formed at a predetermined pitch in each of the plural columns 26A of the wafer-boat 26. The many supporting grooves are adapted to support many semiconductor wafers W as substrates at a predetermined pitch in a tier-like manner.

A lower end of the rotating shaft 24 is attached to an arm 28A of a boat-elevator 28 as a loading mechanism. The boat-elevator 28 is movable vertically. By driving the boat-elevator 28 vertically, the wafer-boat 26 can be loaded into and unloaded out of the processing chamber vessel 4.

An exhausting opening 30 is formed at an upper end of the outside cylinder 8. The exhausting opening 30 is connected to a vacuum exhausting system not shown, which may have a vacuum pump and a unit for removing harmful materials. Thus, the processing chamber vessel 4 can be made a vacuum.

As shown in FIGS. 2 and 3, a substantially half of side wall of the cylindrical inside cylinder 6 on a side with respect to a transverse section thereof forms a thicker side wall 32, which is thicker inward than the other half of side wall on the other side with respect to the transverse section. The other half of side wall on the other side with respect to the transverse section forms a thinner side wall 34. A recess groove 36 is formed in a substantially center of the thicker side wall 32 and in a longitudinal direction thereof. The groove 36 forms a longitudinal gas-introducing slit 38, which opens inward and has a small conductance. Thus, the gas-introducing slit 38 can face one part of a peripheral area of the wafers W. A point end 16A of the gas-introducing nozzle 16 is located at a lower end of the groove 36. Thus, the processing gas is adapted to be introduced into the gas-introducing slit 38.

In the case, each of the wafers W has a size of for example 8 inch. The pitch (distance) of two vertically neighboring wafers W is about 6 mm. The longitudinal length L1 of the groove 36 is about 5 mm to 30 mm. The lateral length L2 of the groove 36 is also about 5 mm to 30 mm. A distance L3 between an inside surface of the thicker side wall 32 and peripheral edges of the wafers is about 3 mm to 20 mm. Thus, the discharging conductance of the gas-introducing slit 38 is small.

A space between the thinner side wall 34 and the other side of the wafers W forms a gas-absorbing opening 40 having a large conductance. The gas-absorbing opening 40 is adapted to absorb the processing gas which flows between the two vertically neighboring wafers. In the case, a distance L4 between an inside surface of the thinner side wall 34 and the peripheral edges of the wafers W is about 20 mm to 50 mm. Thus, the discharging conductance of the gas-absorbing opening 40 is large.

A ceiling board 44 is provided at a ceiling of the inside cylinder 6. The ceiling board 44 has a gas-discharging opening 42 which has the same sectional contour as the gas-absorbing opening 40.

Next, the operation of the above thermal processing unit of the first embodiment is explained as below.

At first, pre-processing semiconductor wafers W are set in the wafer-boat 26 in a tier-like manner. Then, the wafer-boat 26 is loaded into the inside cylinder 6, which is preheated, through the lower opening of the processing chamber vessel 4 by the boat-elevator 28. Then, the opening of the manifold 10 is closed by the cap 20, that is, the chamber vessel 4 is closed hermetically. In the case, the number of the wafers set in the wafer-boat 26 is 40.

Then, power supplied to the heaters not shown is increased in order to heat the wafers W to a processing temperature such as about 530° C. Then, the processing gas such as $SiH_4$ gas or $N_2$ gas, whose flow rate is controlled, is introduced from the gas-introducing nozzle 16 into the chamber vessel 4. At the same time, an inside of the chamber vessel 4 is made a vacuum via the exhausting opening 30 and is maintained at a predetermined processing pressure. Thereafter, the film-forming process starts.

In detail, the processing gas supplied from the point end 16A of the gas-introducing nozzle 16 flows upward in the groove 36 formed in the in side cylinder 6. Then, the process in gas flows in a lateral i.e. horizontal direction through the gas-introducing slit 38 to pass between any two vertically neighboring wafers W and cause decomposing reactions (film-forming reactions) to happen on the wafers W. After that, the processing gas flows into the gas-absorbing opening 40 on the other side, flows upward in the gas-absorbing opening 40, and is exhausted from the chamber vessel 4 through the gas-discharging opening 42 and the exhausting opening 30.

When the processing gas passes between the wafers W, the $SiH_4$ gas reacts to decompose and $SiH_4$ films are formed on the wafers W. In the case, the distance L3 between the inside surface of the thicker side wall 32 and the peripheral edges of the wafers W is so small (the inside surface of the thicker side wall 32 and the peripheral edges of the wafers W are so near to each other) that the discharging conductance of the gas-introducing slit 38 is small. On the other hand, the distance L4 between the inside surface of the thinner side wall 34 and the peripheral edges of the wafers W is so large (the inside surface of the thinner side wall 34 and the peripheral edges of the wafers W are so apart from each other) that the discharging conductance of the gas-absorbing opening 40 is large. As a result, a large amount of pressure difference arises between the gas-introducing slit 38 and the gas-absorbing opening 40. Thus, the processing gas not detours around the wafers but positively flows between the wafers. In addition, the processing gas passes on the wafers quickly.

As a result, the processing gas flows between the wafers efficiently, and the staying time for which the processing gas passes and stays between the wafers becomes short. Thus, the time for which the processing gas is exposed to a high temperature becomes so short that reactions in the gas phase are restrained and that film-forming reactions by surface-reactions are promoted. Therefore, even when the flow rate of the processing gas is high and the processing pressure is higher than the case of the conventional method (maximum 1.5 Torr), surface-reactions become main reactions and films having fine qualities can be deposited. In addition, the film-forming rate can be raised remarkably, that is, the productivity can be raised.

Figure 4:
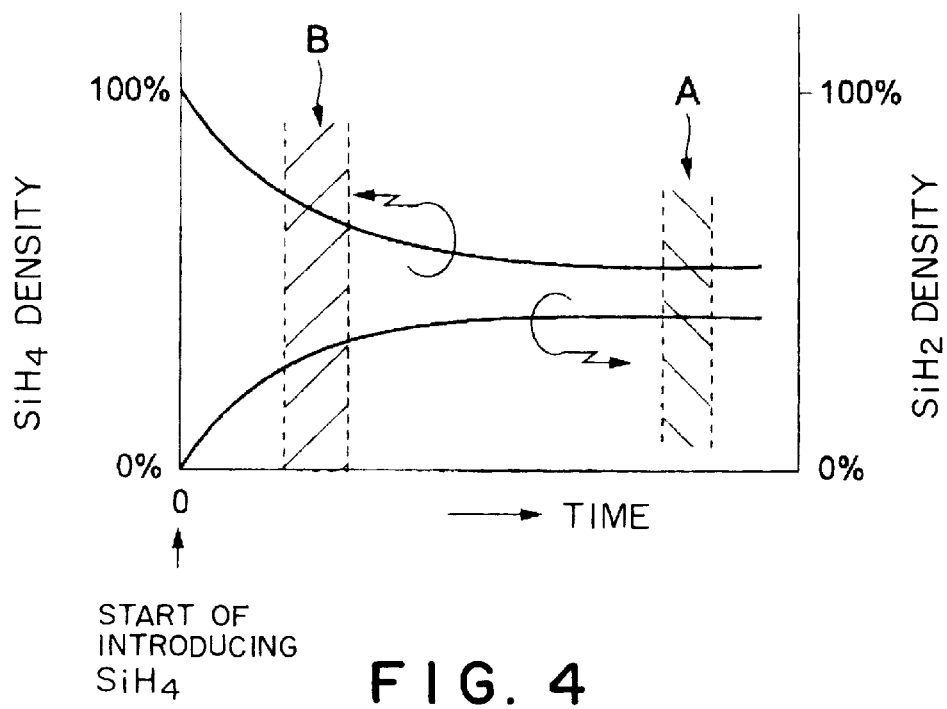
FIG. 4 is a graph showing a relationship between a $SiH_4$ density and a $SiH_2$ density in a gas phase between semiconductor wafers.

The above result is examined making reference to a decomposing reaction of $S1H_4$. $SiH_4$ may be decomposed directly to Si crystal on the wafer by a thermal decomposing, but $SiH_4$ may be decomposed to Si crystal via an intermediate product mainly consisting of $SiH_2$ by a thermal decomposing. A $SiH_4$ density and a SiH density between the semiconductor wafers are shown in FIG. 4. As shown in FIG. 4, the thermal decomposing starts when the $SiH_4$ is introduced. Then, the $SiH_4$ density decreases gradually, but the $SiH_2$ density increases gradually. After a certain time, both the $SiH_4$ density and the $SiH_2$ density are saturated, i.e. become substantially constant.

In the conventional case, the processing gas flows between the wafers at a very low rate. Thus, the condition of the processing gas between the wafers corresponds to zone A in FIG. 4. That is, the $SiH_2$ density in the gas phase is very high, and step coverages of Si crystal films, to which $SiH_2$ has crystallized, are not good. That is, the film quality is not good. Thus, in the conventional case, the processing pressure has to be low in order to restrain reactions in the gas phase and Si crystallization from $SH_2$. However, in the case of the invention, the rate of the processing gas flowing between the wafers is increased, i.e., the staying time for which the processing gas passes and stays between the wafers becomes short. Thus, the condition of the processing gas between the wafers corresponds to zone B in FIG. 4. That is, the $SiH_2$ density in the gas phase is considerably low. Thus, even when the processing pressure is increased for example by increasing the volume of the supplied processing gas, the $SiH_2$ density in the gas phase is not increased and the reactions in the gas phase are not promoted. Thus, surface-reactions become main reactions and films having fine qualities can be deposited at a high film-forming rate.

Next, with respect-to a velocity of the processing gas on the wafers, a simulation result of the first embodiment is compared with a simulation result of the conventional thermal processing unit.

Figure 5:
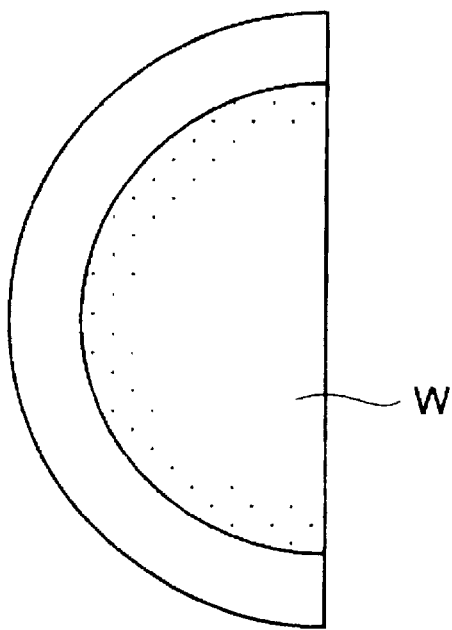
FIG. 5 is an explanatory view of a simulation with respect to a flow-velocity distribution of a processing gas on a semiconductor wafer in the case of a conventional unit.
Figure 6B:
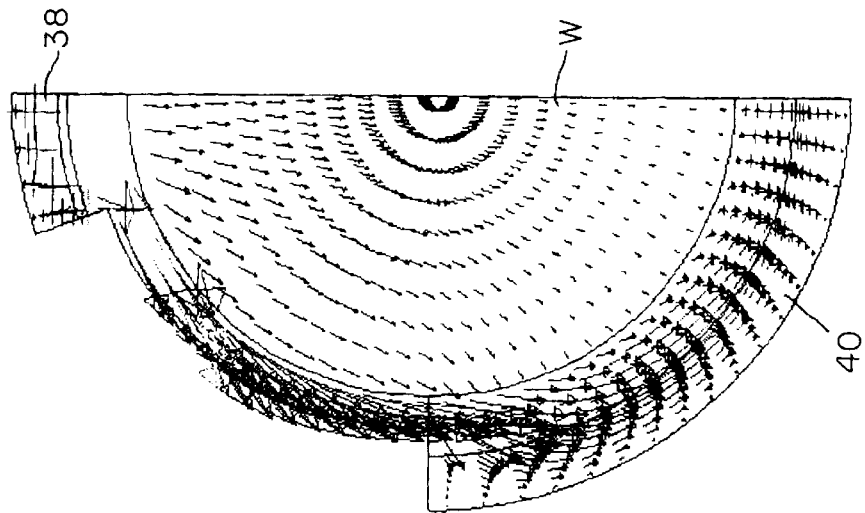
FIGS. 6A and 6B show a simulation model and a calculating result of a simulation, respectively, with respect to a flow-velocity distribution of a processing gas on a semiconductor wafer in the case of the first embodiment of the invention.
Figure 6A:
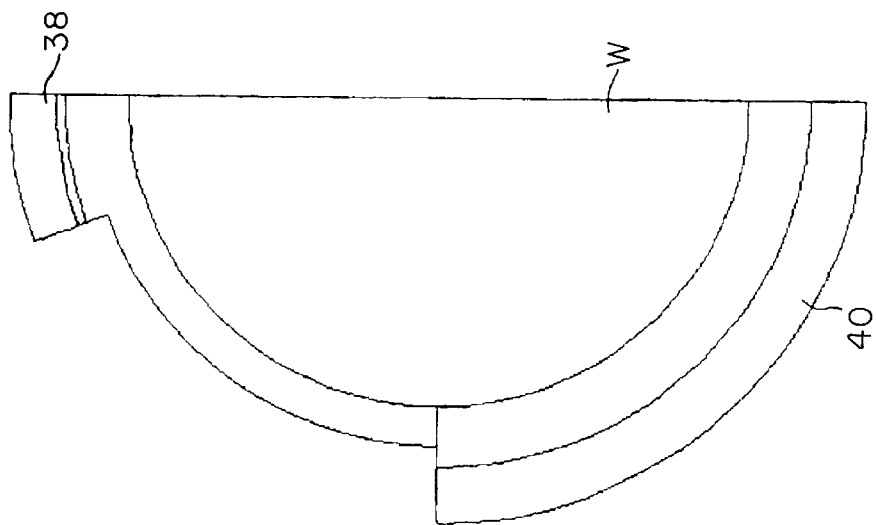

FIG. 5 is an explanatory view of the simulation result with respect to a flow-velocity distribution of a processing gas on a semiconductor wafer in the conventional unit. FIGS. 6A is an explanatory view of a simulation model with respect to a flow-velocity distribution of a processing gas on a semiconductor wafer in the first embodiment of the invention. FIGS. 6B is an explanatory view of the simulation result with respect to the flow-velocity distribution of the processing gas on the semiconductor wafer in the first embodiment of the invention.

Each of FIGS. 5, 6A and 6B shows a half area of the wafer W. The processing conditions of the conventional unit and the first embodiment are identical. The common processing temperature is 530° C., the common processing pressure is 1.0 Torr, and the common flowing volume of the processing gas is 500 sccm. The lengths of the arrows in FIGS. 5 and 6B represent flow velocities of the processing gas at those points respectively.

As seen from the FIG. 5, the arrows in FIG. 5 look like substantially dots, i.e., the flow velocities of the processing gas by the conventional unit are very low. On the other hand, as seen form the FIG. 6B, the arrows in FIG. 6 are considerably long, i.e., the flow velocities of the processing gas by the first embodiment are considerably high, for example 0.04 m/sec.

Figure 7:
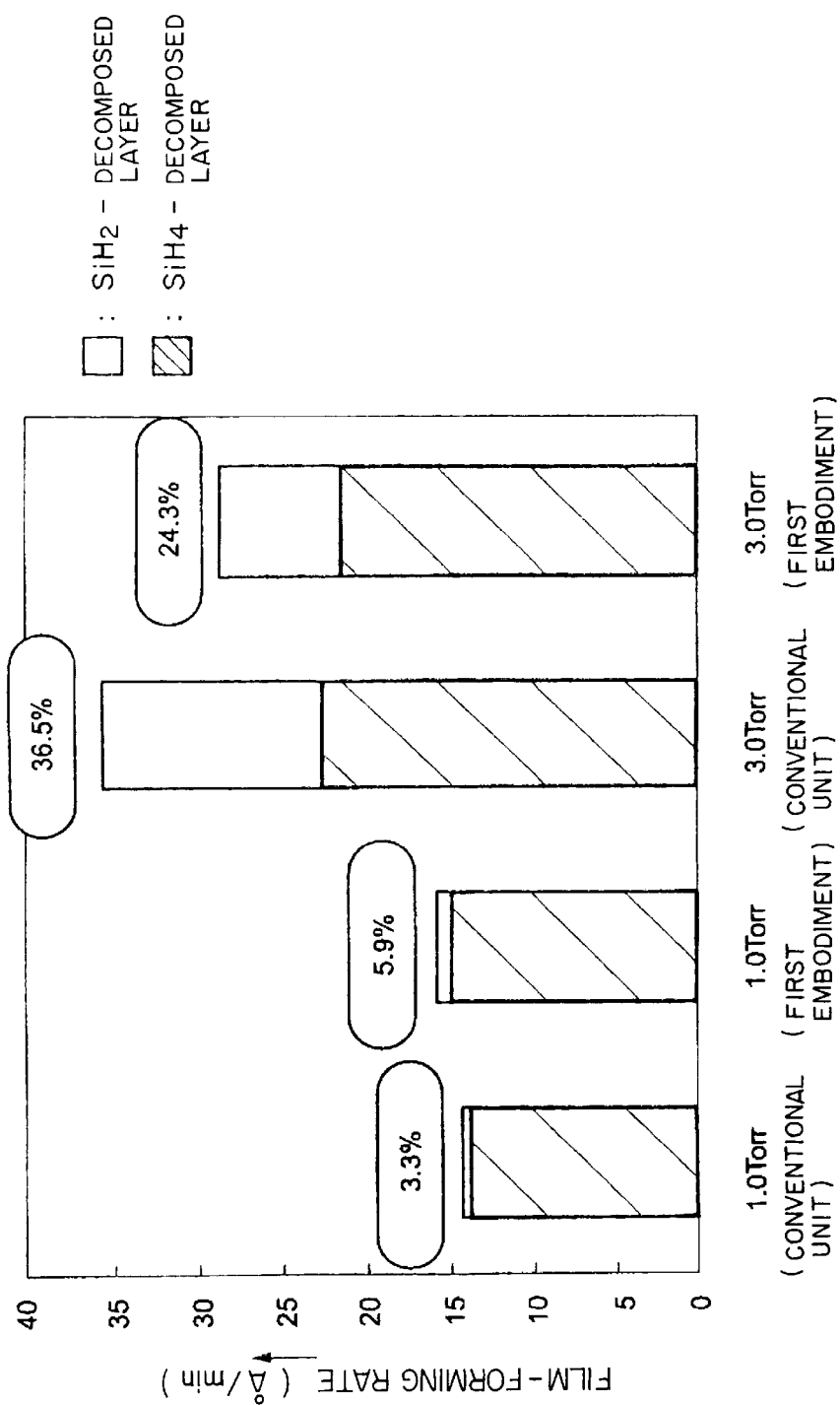
FIG. 7 is a graph showing each of film-qualities by the conventional unit and the first embodiment of the invention, and dependence of film-forming rates on processing pressures.

Film-qualities by the conventional unit and the first embodiment of the invention, and dependence of the film-forming rates on the processing pressures were actually measured. The results are explained as below with reference to FIG. 7. In the case, the film-qualities by the conventional unit and the first embodiment of the invention were examined in the condition of processing pressures 1.0 Torr and 3.0 Torr, respectively. Other processing conditions are common, i.e., the processing temperature is 500° C. and the flowing volume of $SiH_4$ is 500 sccm. In FIG. 7, shaded portions represent $SiH_4$-decomposed layers (Si crystal layer to which $SiH_4$ has crystallized) which have fine film-qualities, and plain portions represent $SiH_2$-decomposed layers (Si crystal layer to which $SiH_2$ has crystallized) which have bad film-qualities. The values in the graph represent film-forming contributing ratios of $SiH_2$-decomposed layers with respect to the respective whole film-forming rates.

As shown in FIG. 7, when the processing pressure is low such as 1.0 Torr, the film-forming rates by the conventional unit and the first embodiment of the invention are both low, about 15 Å/min. That is, there is no essential difference in the film-forming rates by the conventional unit and the first embodiment of the invention. When the processing pressure is 3.0 Torr, the film-forming rates by the conventional unit and the first embodiment of the invention are about 36 Å/min and about 28 Å/min, respectively. That is, the film-forming rates are both high. In the case, the film-forming rate by the conventional unit is higher than that by the first embodiment of the invention, but the contributing ratio of the $SiH_2$-decomposed layer having a bad film-quality by the conventional unit is 36.5%, i.e., relatively high. On the other hand, the contributing ratio of the $SiH_2$-decomposed layer by the first embodiment of the invention is 24.3%, i.e., relatively low. As a result, the film-quality by the first embodiment of the invention is better than that by the conventional unit.

Next, dependence of the film-qualities on the volumes of supplied processing gas is examined by using the first embodiment of the invention. The result is explained with reference to FIG. 8.

In the case, the thermal processing unit of the first embodiment of the invention was used wherein the processing temperature was fixed at 530° C. and the processing pressure was fixed at 3 Torr. The flowing volume of $SiH_4$ was changed among 500 sccm, 1000 sccm and 1500 sccm.

Figure 8:
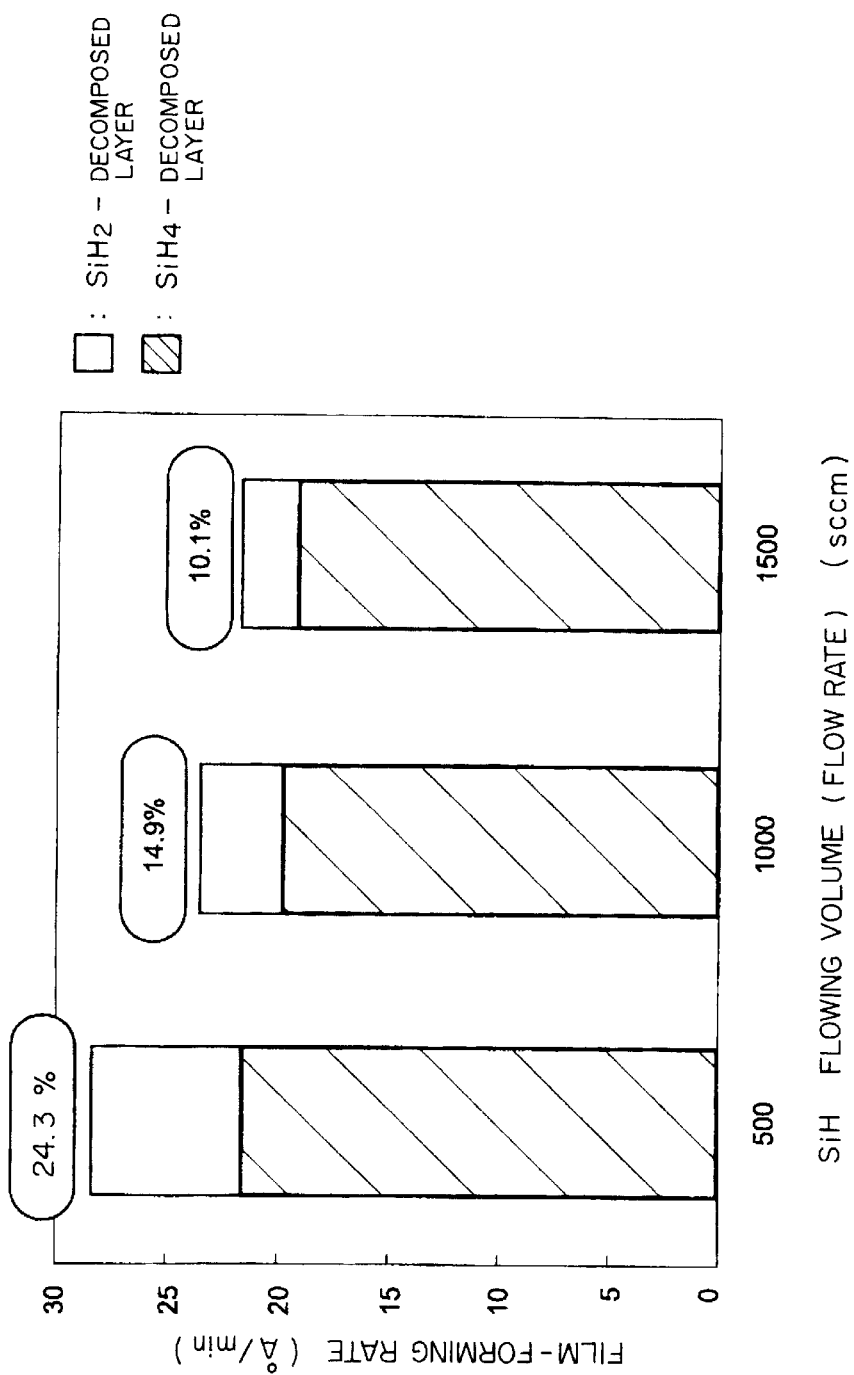
FIG. 8 is a graph showing dependence of film-qualities on volumes of supplied processing gas in the case of the first embodiment of the invention.

As shown in FIG. 8, the film-forming rate drops little by little as the flowing volume of $SiH_4$ is increased. At the same time, the contributing ratio of the $SiH_2$-decomposed layer having a bad film-quality with respect to the whole film-forming rate drops considerably in order of 24.3%, 14.9% and 10.1%. Therefore, it can be judged that it -is preferable to increase the flowing volume of the $SiH_4$ because films having fine qualities can be obtained although the whole film-forming rate drops a little.

Next, dependence of $SiH_2$ densities with respect to $SiH_4$ flowing volumes on processing pressures is examined. The result is explained with reference to FIG. 9.

In the case, the thermal processing unit of the first embodiment of the invention was used wherein the processing temperature was fixed at 530° C. The flowing volume of $SiH_4$ was changed. The processing pressure was changed among 3 Torr, 4.5 Torr and 7 Torr.

Figure 9:
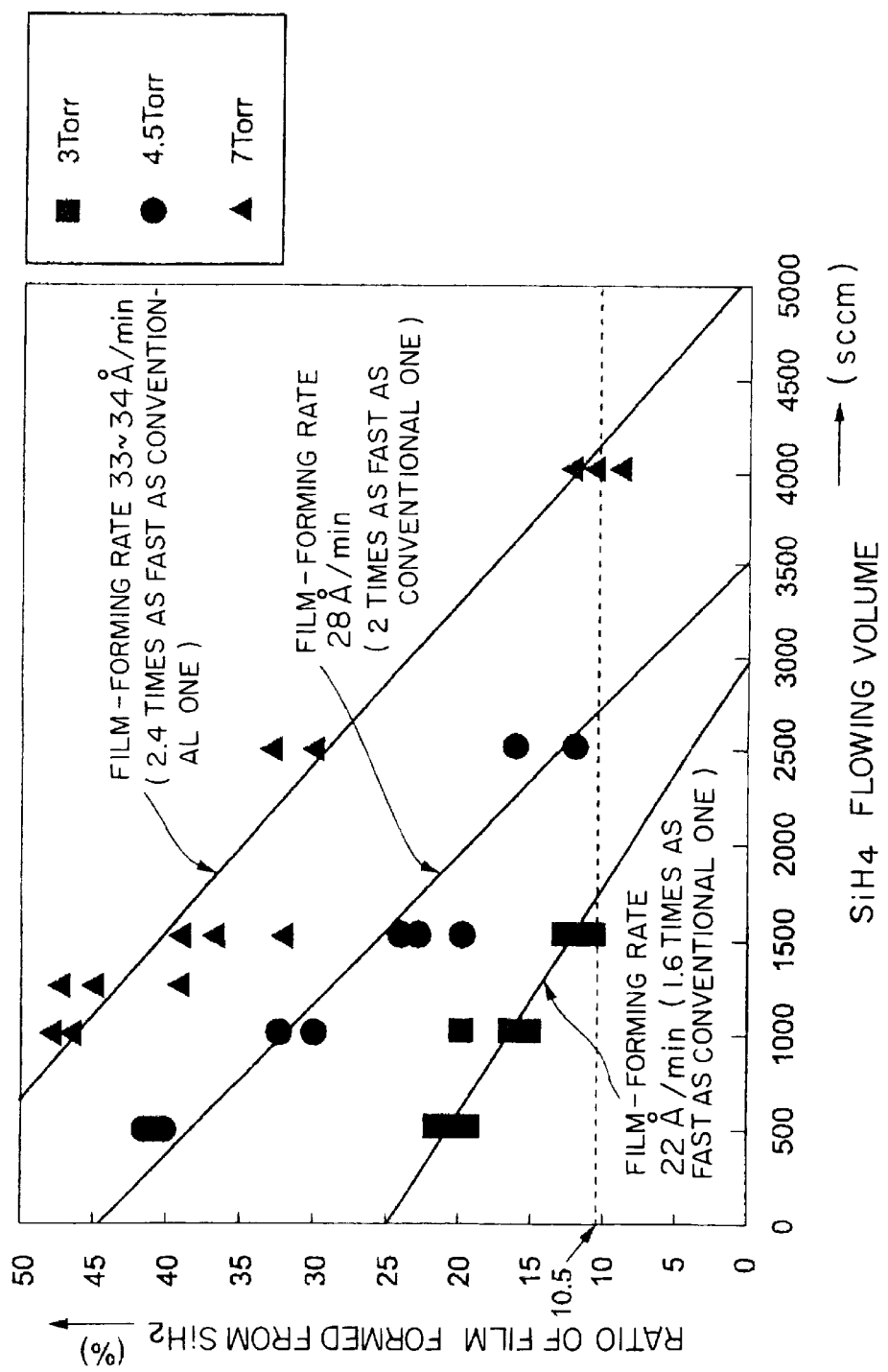
FIG. 9 is a graph showing dependence of $SiH_2$ densities with respect to $SiH_4$ flowing volumes on processing pressures.

As shown in FIG. 9, the $SiH_2$ density (ratio of the film formed from $SiH_2$) drops, i.e., becomes better as the flowing volume of $SiH_4$ is increased. In FIG. 7, the plurality of data in the same condition correspond to a top wafer, a middle wafer and a bottom wafer in the wafer-boat 26, respectively.

As shown in FIG. 9, each of the film-forming rates in the processing pressures 3.0 Torr, 4.5 Torr and 7 Torr is considerably higher than that in the conventional condition. In addition, the higher the processing pressure is, the higher the film-forming rate is.

Therefore, in order to control the $SiH_2$ density not more than an allowable value such as 10.5% (the value is explained as below), the flowing volume of $SiH_4$ should be not less than 1700 sccm when the processing pressure is 3 Torr, the flowing volume of $SiH_4$ should be not less than 2700 sccm when the processing pressure is 4.5 Torr, and the flowing volume of $SiH_4$ should be not less than 4100 sccm when the processing pressure is 7 Torr.

The reason that the allowable value of the $SiH_2$ density should be 10.5% is that the $SiH_2$ density has to be not more than 10.5% in order to achieve step coverage not less than 97%, which is seen from FIG. 10 showing a relationship between $SiH_2$ densities and step coverages (hole diameter: 0.4 μm, depth: 1 μm).

The dimensions of the members of the first embodiment, the shape of the gas-introducing slit 38, the shape of the gas-absorbing opening 40 and so on are not limited by the above example. For example, a plurality of gas-introducing slits 38 maybe formed in the thicker side wall 32. In addition, the peripheral length of the thicker side wall 32 may be longer and the peripheral length of the gas-absorbing opening 40 may be shorter.

In the above thermal processing unit of the first embodiment, the wafer-boat 26 is a common one, the chamber vessel 4 includes double cylinders, and the gas-introducing slit 38 and the gas-absorbing opening 40 are formed by contriving the shape of the inside cylinder 6 of the chamber vessel 4. However, the above manners do not intend to limit the invention. For example, as a second embodiment described below, the chamber vessel may include a single cylinder, the gas-introducing slit and the gas-absorbing opening may be formed in the single cylinder, and the shape of the wafer-boat may be changed to prevent the processing gas from detouring around the wafers and to cause the processing gas to pass between the wafers more efficiently.

Figure 11:
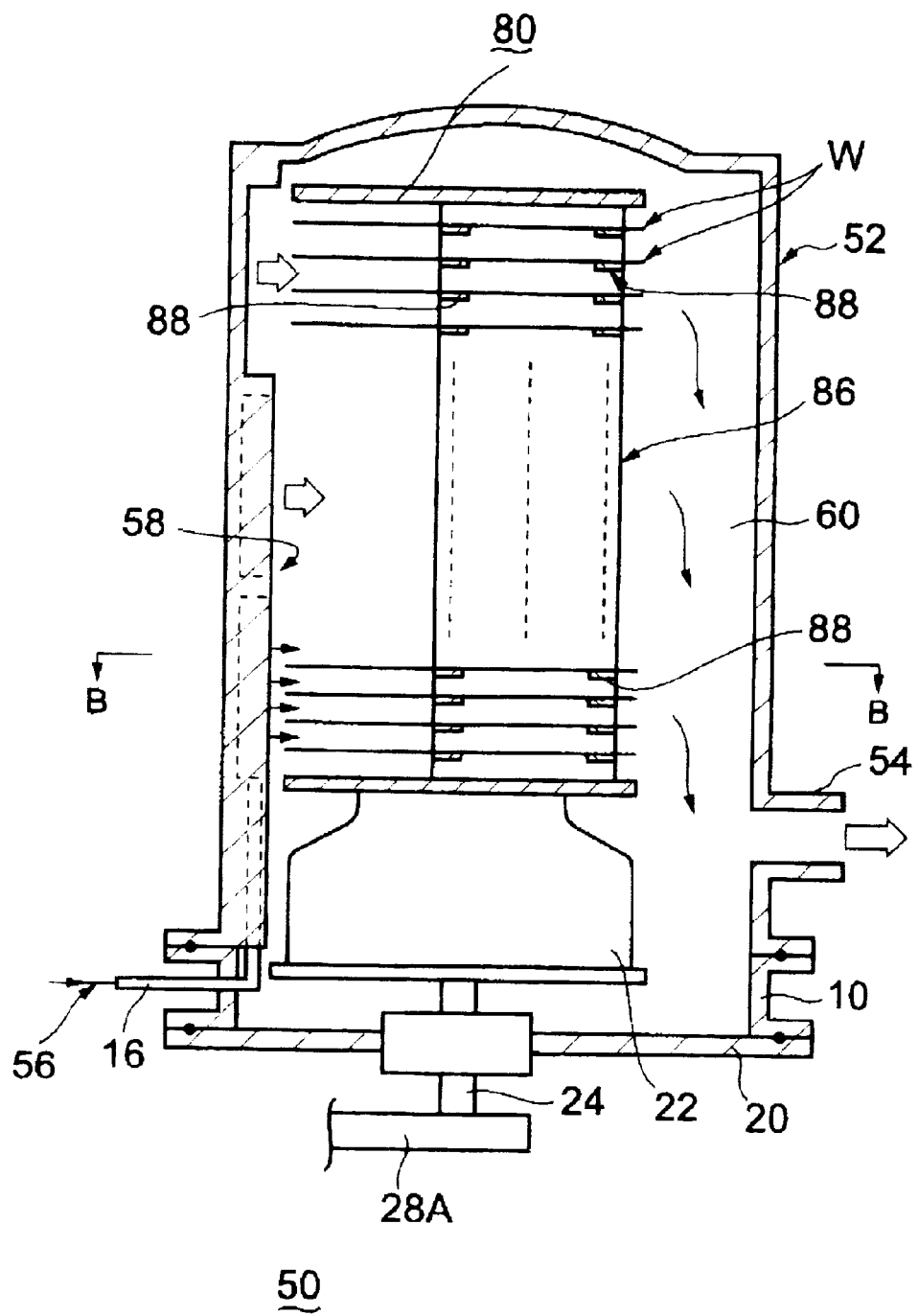
FIG. 11 is a schematic longitudinal sectional view of a second embodiment of the thermal processing unit according to the invention.
Figure 12:
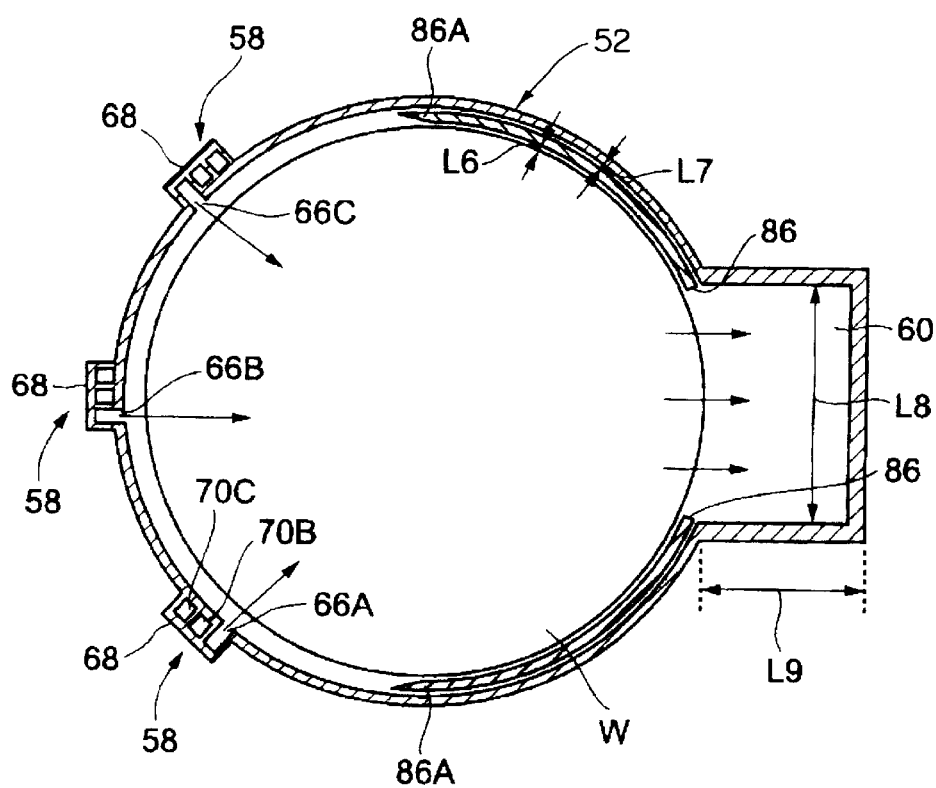
FIG. 12 is a schematic transverse sectional view taken along B—B line of FIG. 11.
Figure 13:
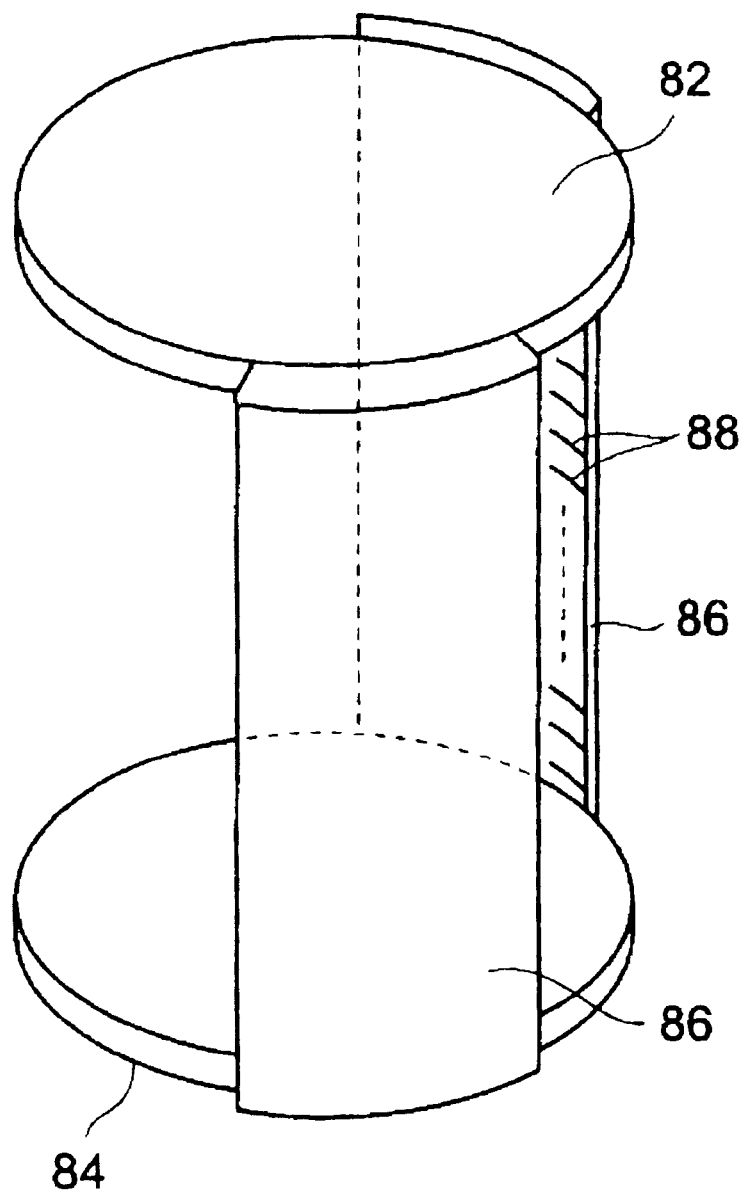
FIG. 13 is a schematic perspective view of a wafer-boat as a substrate-holder.
Figure 14:
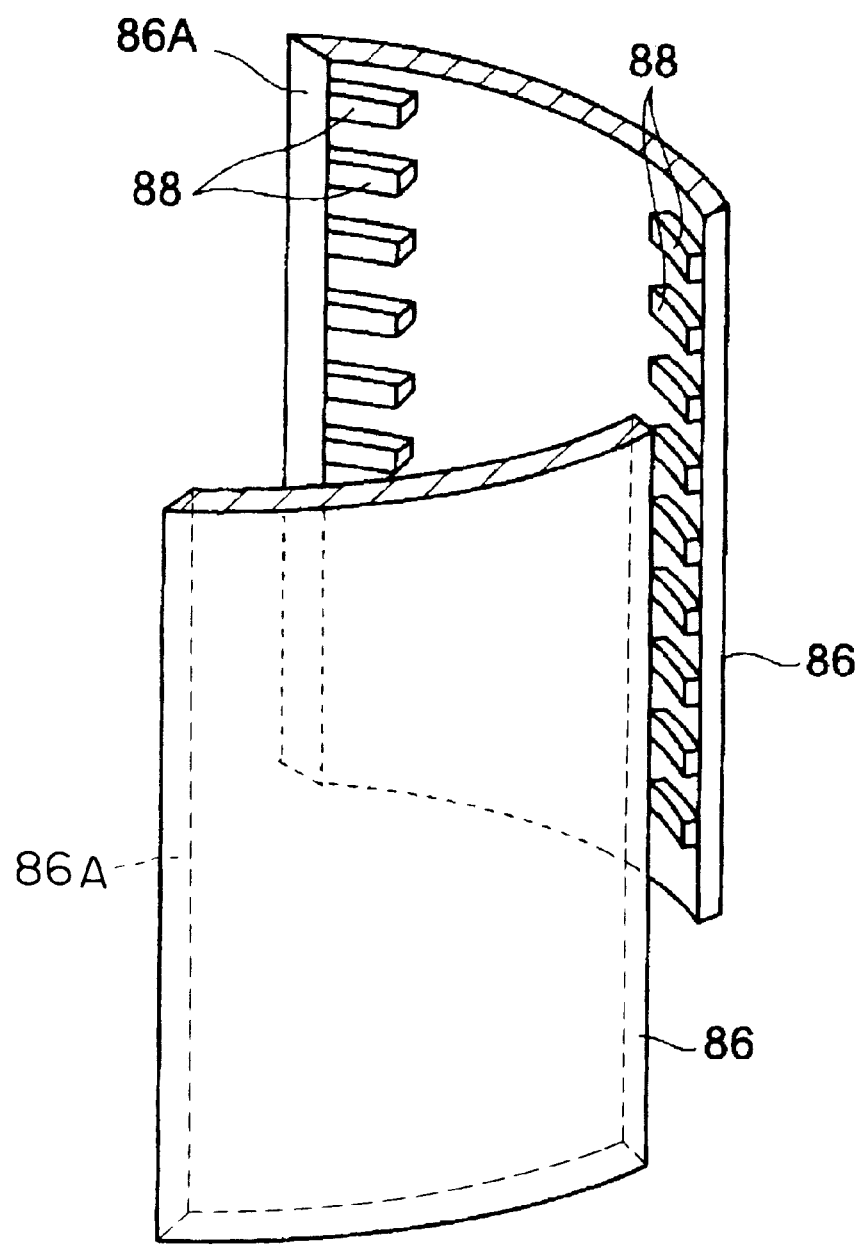
FIG. 14 is a partial sectional perspective view of the wafer-boat shown in FIG. 13.
Figure 16:
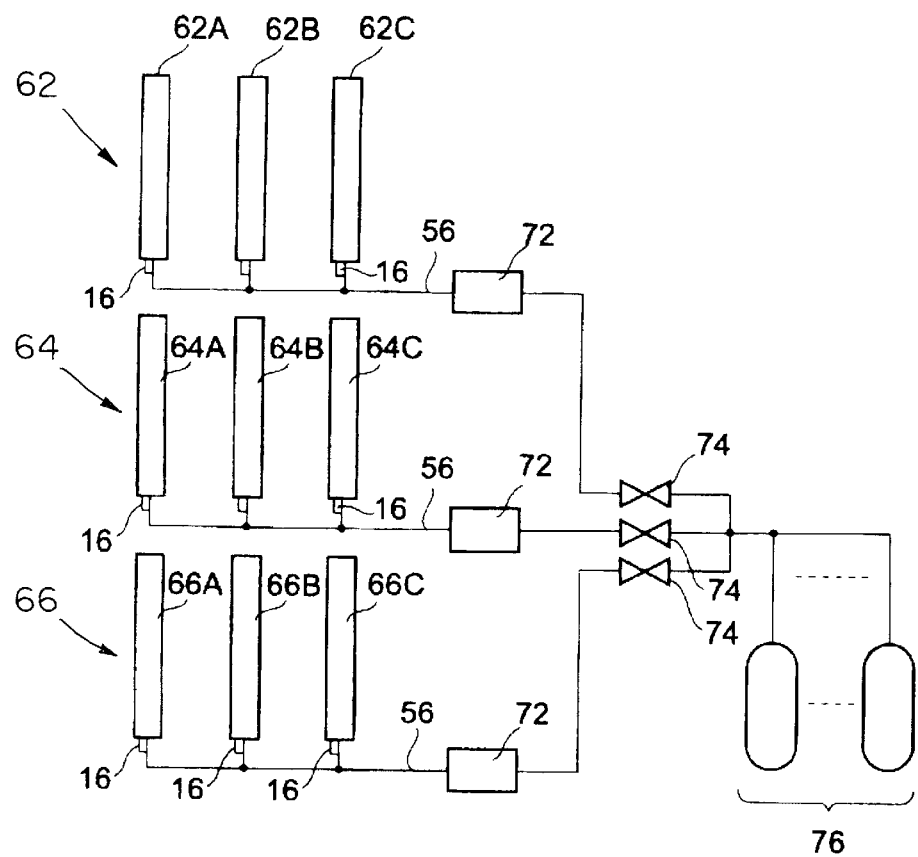
FIG. 16 is a schematic block diagram showing a supplying system of a processing gas.

FIG. 11 is a schematic longitudinal sectional view of the second embodiment of the thermal processing unit according to the invention. FIG. 12 is a schematic transverse sectional view taken along B—B line of FIG. 11. FIG. 13 is a schematic perspective view of a wafer-boat as a substrate-holder. FIG. 14 is a partial sectional perspective view of the wafer-boat shown in FIG. 13. FIG. 15 is a partial sectional perspective view of the processing chamber vessel. FIG. 16 is a schematic block diagram showing a supplying system of a processing gas. In the second embodiment, the same numeral references correspond to the same structures as the first embodiment. The explanation of the same structures is not repeated.

As shown in FIGS. 11 to 16, the thermal processing unit 50 has a processing chamber vessel 52 of a single cylinder. A exhausting opening 54 for making an inside of the chamber vessel 52 a vacuum is provided at a lower portion of a side wall of the chamber vessel 52. Similarly to the first embodiment, gas-introducing nozzles 16, which are bent to have L-like shapes, pierce through the manifold 10. Each of the gas-introducing nozzles 16 is connected to a gas tube 56 and is adapted to introduce a processing gas or another necessary gas into the chamber vessel 52. Only one nozzle 16 is shown in FIG. 11, but actually a plurality of nozzles 16 are arranged.

A gas-introducing slit 58 having a small conductance is formed in a side wall on one side of the chamber vessel 52. On the other side of the chamber vessel 52, a gas-absorbing opening 60 having a large conductance is formed by outward denting the side wall partially. In detail, as shown in FIG. 15, the gas-introducing slit 58 is divided into three zone-slits 62, 64, 66 which respectively correspond to three zones divided in the vertical direction (in which the plurality of substrates are arranged). Each of the plurality of zone-slits 62, 64, 66 is divided into three slit-elements 62A to 62C, 64A to 64C, 66A to 66C which respectively correspond to three peripheral areas A, B, C of the side wall of the processing chamber vessel 52 (three peripheral areas A, B, C of a plurality of substrates). That is, the gas-introducing slit 58 is divided into nine slit-elements 62A to 62C, 64A to 64C and 66A to 66C. Three slit-elements belonging to the same peripheral area, for example slit-members 62A, 64A and 66A, are arranged side by side in the peripheral direction.

Each of the slit-members 62A to 62C, 64A to 64C and 66A to 66C pierces through the side wall of the chamber vessel 52. Three longitudinal tube-forming members 68 made of crystal are joined to portions of an outside surface of the side wall of the chamber vessel 52 for example by welding, each of which portions corresponds to the three slit-members (62A, 64A and 66A etc.) of the common peripheral area. In each of the tube-forming members 68, three grooves 70A, 70B and 70C are formed. The three grooves 70A, 70B and 70C have different lengths. The length of the groove 70A corresponds to a level of the slit-members 62A to 62C (zone-slit 62). The length of the groove 70B corresponds to a level of the slit-members 64A to 64C (zone-slit 64). The length of the groove 70C corresponds to a level of the slit-members 66A to 66C (zone-slit 66). The tube-forming members 68 are joined to the outside surface of the processing chamber vessel 52 in such a manner that the respective grooves 70A communicate with the slit-members 62A, 62B and 62C respectively, the respective grooves 70B communicate with the slit-members 64A, 64B and 64C respectively, and the respective grooves 70C communicate with the slit-members 66A, 66B and 66C respectively. Each of the gas-introducing nozzles 16 corresponds to each of the slit-members separately. In the case, the processing chamber vessel 52 has an effective height of 900 mm. The length (height) and the width of each of the slit-members is about 300 mm and about 10 mm, respectively. The longitudinal length and the lateral length of the cross section of each of the grooves 70A to 70C are both about 10 mm.

A system for supplying a processing gas into the slit-members 62A to 62C, 64A to 64C and 66A to 66C is shown in FIG. 16. The slit-members arranged at the same height level (the same zone), i.e., the slit-members belonging to the same zone slit are connected to a common gas pipe 56. Each of the three gas pipes 56 which correspond to the three zone respectively is connected to a common processing gas source 76 via a flow-controller 72 and an open-and-close valve 74. The flow-controller 72 may be for example a mass-flow-controller that can be controlled independently.

As shown in FIGS. 13 and 14, a wafer-boat 80 as a substrate holder consists of a ceiling board 82, a bottom board 84 and two board-members 86 joined between the ceiling board 82 and the bottom board 84. Each of the board-members 86 has an arc section. A plurality of supporting projections 88 for supporting a peripheral lower surface of a wafer are formed at each of predetermined heights of an inside surface of each of the board-members 86. For example, the predetermined heights may be determined in such a manner that 90 to 100 wafers W are supported at a predetermined pitch in a tier-like manner. The projections 88 may be replaced with supporting grooves.

As shown in FIG. 12, the two board-members 86 are apart from each other by a distance corresponding to a width L8 of a gas-absorbing opening 60. In addition, the two board-members 86 and the gas-absorbing opening 60 occupy a substantially semi-cylindrical area. The thickness L6 of each of the board-members 86 is relatively thick, for example 5 to 7 mm. A distance L7 between the board-members 86 and an inside surface of the chamber vessel 52 is relatively small, for example about 2 to 5 mm. Thus, the processing gas is restrained from detouring around the wafers W, i.e., passing an outside area of the peripheries of the wafers W. In addition, a side edge 86A far from the gas-absorbing opening of each of the board-members 86 has a shape inclined toward a center area of the wafers in a flowing direction of the processing gas. Thus, the processing gas going to detour around the wafers is guided between the wafers efficiently.

If the wafer has a size of 8 inch, the width L8 and the depth L9 of the cross section of the gas-absorbing opening 60 are about 50 to 100 mm and about 25 to 30 mm, respectively. However, the values do not intend to limit the invention.

Figures 17A, 17B:
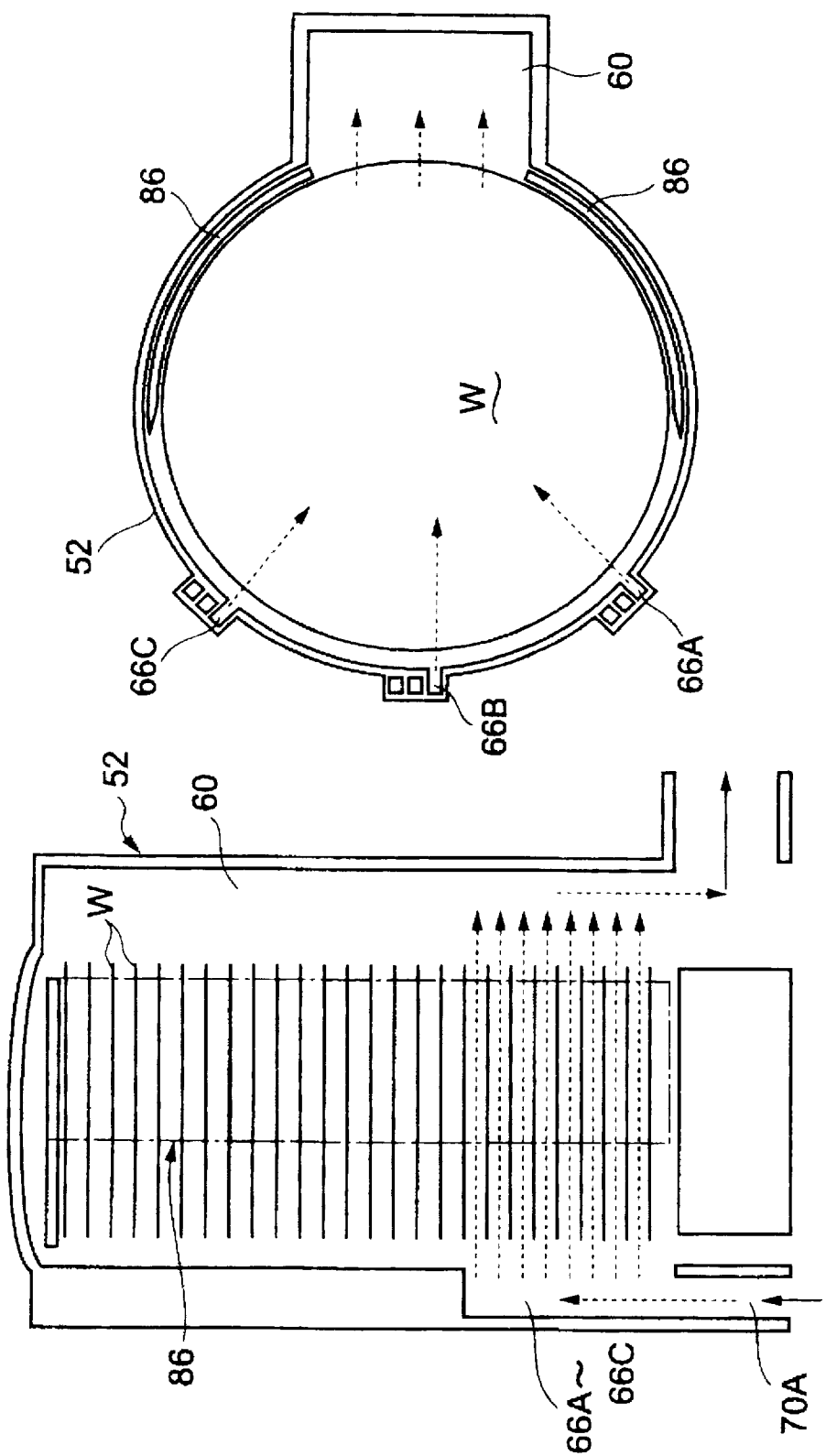
FIGS. 17A and 17B are a longitudinal sectional view and a transverse sectional view, respectively, showing flow-conditions of processing gas in the second embodiment of the invention.
Figures 18A, 18B:
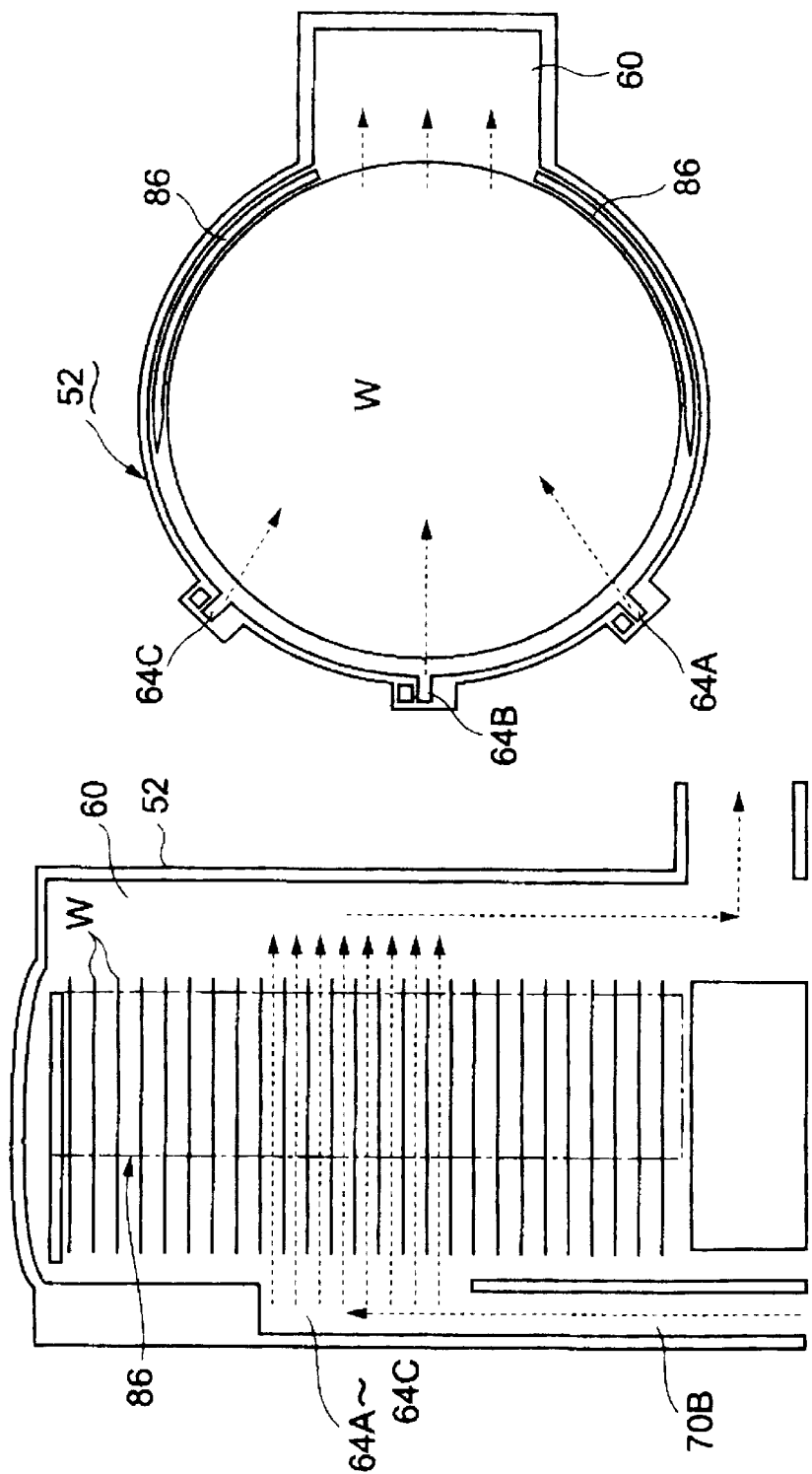
FIGS. 18A and 18B are a longitudinal sectional view and a transverse sectional view, respectively, showing flow-conditions of processing gas in the second embodiment of the invention.
Figures 19A, 19B:
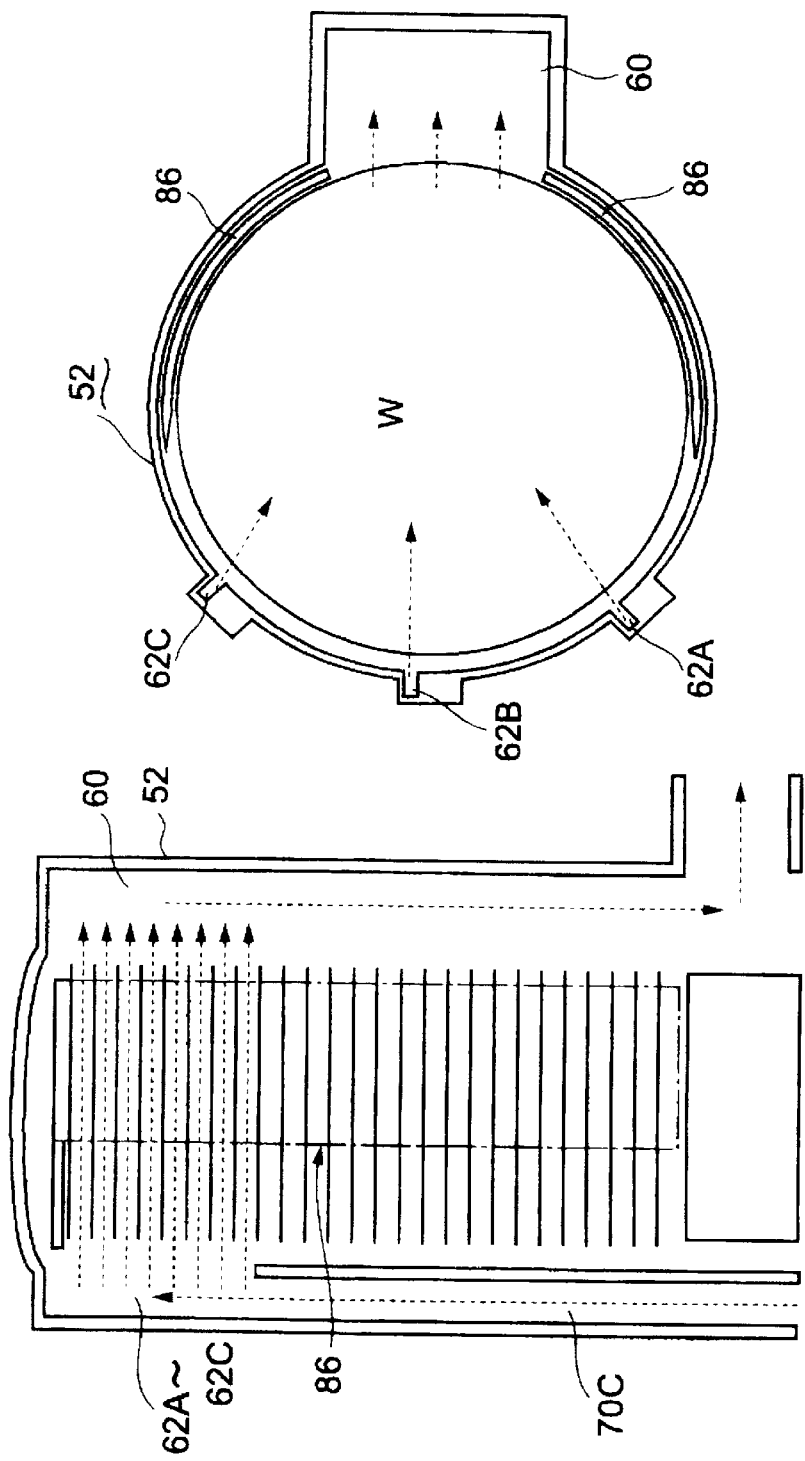
FIGS. 19A and 19B are a longitudinal sectional view and a transverse sectional view, respectively, showing flow-conditions of processing gas in the second embodiment of the invention.

Next, a film-forming method using the above second embodiment of the invention is explained with reference to FIGS. 17A to 19B. FIGS. 17A and 17B are a schematic longitudinal sectional view and a schematic transverse sectional view showing flow-conditions of processing gas in a lower portion of the second embodiment, respectively. FIGS. 18A and 18B are a schematic longitudinal sectional view and a schematic transverse sectional view showing flow-conditions of processing gas in a middle portion of the second embodiment, respectively. FIGS. 19A and 19B are a schematic longitudinal sectional view and a schematic transverse sectional view showing flow-conditions of processing gas in an upper portion of the second embodiment, respectively.

As shown in FIG. 11, a processing gas supplied from the processing gas source 76 (see FIG. 16) during a film-forming process flows into the grooves 70A to 70C (see FIG. 15) via respective corresponding nozzles 16. The flowing volumes of the processing gas supplied into the respective zones are suitably controlled. The processing gas flows upward in the respective grooves, and is spouted out from the slit-members 62A to 62C, 64A to 64C and 66A to 66C (from the gas-introducing slit 58) into the processing chamber vessel 52. The spouted processing gas passes between the wafers W, flows into the gas-absorbing opening 60, flows downward in the gas-absorbing opening 60, and is exhausted outside from the exhausting opening 54.

The volumes of processing gas supplied into the respective zone slits 62, 64 and 66 (the slit-members 62A to 62C, 64A to 64C and 66A to 66C) are controlled by the respective flow-controllers 72. A gas density at a portion nearer to the exhausting opening 54 connected to the gas-absorbing opening 60 is tend to be smaller. On the other hand, a gas density at a portion further from the exhausting opening 54 is tend to be larger. In the case, it may be difficult to assure a film-thickness uniformity in wafer to wafer. That is, a thickness of a film formed on a wafer W at the portion near to the exhausting opening 54 may be thinner than that of another film formed on another wafer W at the portion far from the exhausting opening 54. In order to solve the problem, it is preferable to adjust the flow-controllers 72 corresponding to the respective zones in such a manner that the volume of the processing gas supplied into the slit-members 66A to 66C, that are relatively near to the exhausting opening 54, is more than that supplied into the slit-members 64A to 64C, that are relatively far from the exhausting opening 54. Similarly, it is preferable that the volume of the processing gas supplied into the slit-members 64A to 64C, that are relatively near to the exhausting opening 54, is more than that supplied into the slit-members 62A to 62C, that are relatively far from the exhausting opening 54. That is, it is preferable that the volumes of the processing gas are more in order of supplied into the slit-members 62A to 62C, supplied into the slit-members 64A to 64C and supplied into the slit-members 66A to 66C. That is, it is preferable that when the slit-members are nearer to the exhausting opening 54, the volume of the processing gas supplied into the slit-members is more. Thus, the processing gas density may be uniform in the processing chamber vessel 52 regardless of the distance from the exhausting opening 54, so that the thickness of the film formed on the wafer W may be more uniform in wafer to wafer.

In the second embodiment, similarly to the first embodiment, the gas-introducing slit 58 has a small discharging conductance and the gas-absorbing opening 60 has a large discharging conductance. Thus, a large amount of pressure difference arises between the gas-introducing slit 58 and the gas-absorbing opening 60. Thus, the processing gas efficiently flows between the wafers and a film-forming process is efficiently conducted by thermal decomposing of $SiH_4$.

Especially, in the second embodiment, since the two board-members 86 forming the wafer-boat 86 are arranged very near to the inside surface of the side wall of the chamber vessel, the board-members 86 function as baffle plates to prevent the processing gas from detouring around the wafers and to guide the processing gas between the wafers. In addition, since the side edges 86A of the board-members 86 are inclined, the processing gas going to detour around the wafers is more efficiently guided toward the center area of the wafers. Thus, compared with the first embodiment, the processing gas is used more efficiently because it is possible to force a larger part of the processing gas to pass between the wafers. That is, the whole supplied processing gas may be reduced.

Figure 20B:
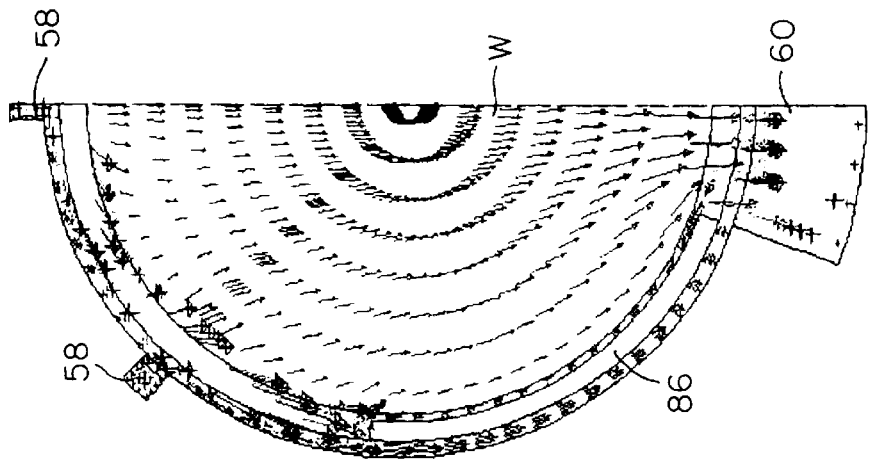
FIGS. 20A and 20B show a simulation model and a calculating result of a simulation, respectively, with respect to a flow-velocity distribution of a processing gas on a semiconductor wafer in the case of the second embodiment of the invention.
Figure 20A:
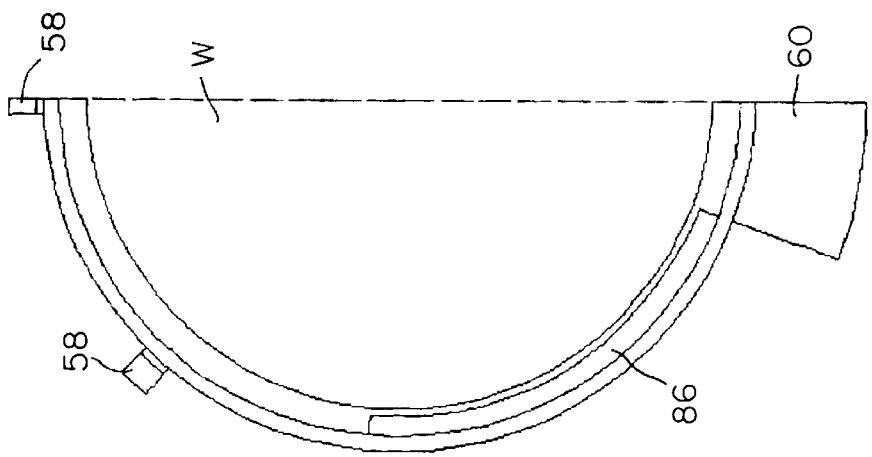
Figure 21:
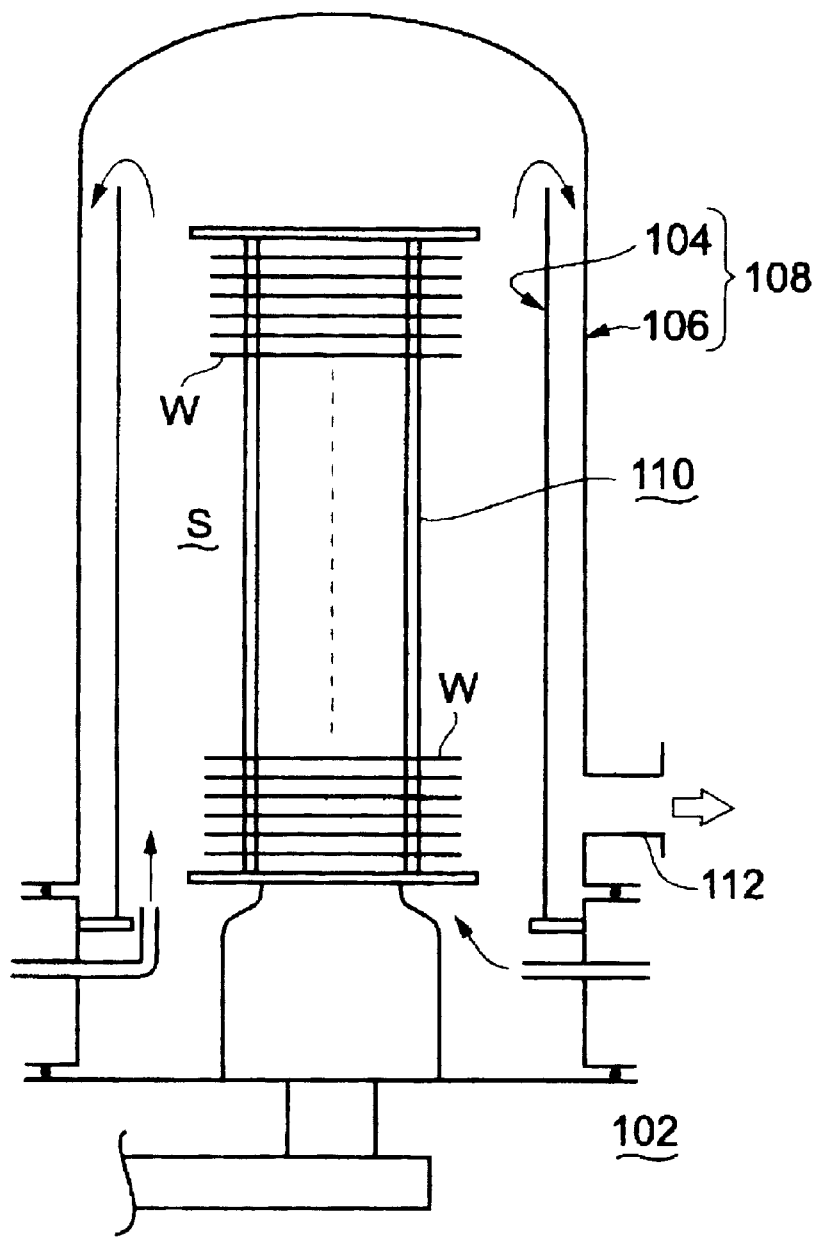
FIG. 21 is a schematic longitudinal sectional view of a common batch-type thermal processing unit.

In addition, as shown in FIGS. 17A to 19B, since the processing gas is supplied from the three zones divided in the vertical direction and from the three areas angularly divided in the peripheral direction, the processing gas may be supplied more uniformly on the respective wafers. Thus, the film-thickness uniformity within a wafer and the film-thickness uniformity in wafer to wafer may be maintained at respective higher levels. This was examined by a simulation, which is explained with reference to FIGS. 20A and 20B. FIG. 20A is an explanatory view of a simulation model with respect to a flow-velocity distribution of a processing gas on a semiconductor wafer in the second embodiment of the invention. FIG. 20B is an explanatory view of a simulation result with respect to the flow-velocity distribution of the processing gas on the semiconductor wafer in the second embodiment of the invention. Similarly to the FIG. 6B, the lengths of shown arrows represent flow velocities of the processing gas at those points. In the result of the first embodiment shown in FIG. 6B, considerable much processing gas densely flows between the peripheral edge of the wafer and the inside surface of the chamber vessel. On the other hand, in the result of the second embodiment shown in FIG. 20B, since the board-members 86 prevent the processing gas from passing the outside of the periphery of the wafer, little processing gas detours around the wafer and much processing gas flows on the wafer. That is, it can be judged that the processing gas may be used more efficiently in the second embodiment. In addition, the flow velocities of the processing gas in the second embodiment are about 0.15 m/sec, which is considerably higher than 0.04 m/sec in the first embodiment shown in FIG. 6B. Therefore, a necessary flowing volume of the processing gas may be reduced to one fourth.

In addition, in the second embodiment, the gas-introducing slit 58 is divided into three zone-slits 62, 64 and 66, and each of the zone-slits is divided into three slit-members 62A to 62C, 64A to 64C and 66A to 66C. However, the gas-introducing slit 58 may be divided into any other number of zone slits, and each of the zone slits may be divided into any other number of slit-members.

In addition, the gas-introducing slit 38, 58 of the first or the second embodiment has such a relatively large opening area that the gas-introducing slit 38, 58 may not be covered and closed by one or more films formed by one or more film-forming processes, even when the film-forming process is repeated so many times. This is a remarkable advantage, compared with the case of using gas-introducing hole having a relatively small opening area.

In addition, the thermal process is not limited to a film-forming process for forming a poly-Silicon film, an amorphous film, or the like, but may be a oxidation diffusion process, an annealing process, or the like.

The substrate is not limited to the semiconductor wafer, but may be an LCD substrate, a glass substrate or the like.

As described above, according to the thermal processing unit and the thermal processing method of the invention, following advantage may be obtained.

At first, the processing gas is efficiently caused to pass between the substrates because the processing gas flows from the gas-introducing slit having the small conductance to the gas-absorbing opening having the large conductance. Thus, the thermal process by the processing gas can be promoted so that the thermal processing rate can become higher. For example, when the thermal process is a film-forming process, films having fine qualities can be formed at a high film-forming rate.

When the gas-introducing slit is divided into a plurality of zone-slits which respectively correspond to a plurality of zones divided in the direction in which the plurality of substrates are arranged, and the flowing volume of the processing gas supplied into each of the zone-slits is controlled independently, the processing gas can be supplied substantially uniformly in the direction in which the plurality of substrates are arranged. Thus, the uniformity of thermal process in wafer to wafer may be improved.

When the gas-introducing slit is divided into a plurality of area-slits which respectively correspond to a plurality of areas angularly divided in the peripheral direction of the plurality of substrates, the processing gas can be supplied substantially uniformly in each wafer. Thus, the uniformity of thermal process within each wafer may be improved.

When the board-members functioning as baffle plates are provided for preventing the processing gas from flowing into the outside of the periphery of the substrate, more processing gas flows between the wafers. That is, the film-forming rate of the thermal process may be improved.

What is claimed is:

1. A thermal processing unit comprising:

a substrate-holder which can support a plurality of substrates in such a manner that the plurality of substrates are arranged in a tier-like manner at regular intervals along a vertical direction, the holder holding the plurality of substrates horizontally so as to be perpendicular to the vertical direction and in parallel with each other, a chamber vessel for housing the substrate-holder, the chamber vessel having an inside in which a vacuum can be created, a gas-introducing slit having an introducing conductance provided in one part of a peripheral area that is peripheral to the plurality of substrates held by the substrate holder, said gas-introducing slit extending in the vertical direction and supplying a processing gas for a thermal process into the chamber vessel, a gas absorbing opening having an absorbing conductance that is relatively larger than the introducing conductance, the gas absorbing opening being provided in another part of the peripheral area, the gas-absorbing opening extending in the vertical direction, and a loading mechanism for loading and unloading the substrate-holder into and out of the chamber vessel.

2. A thermal processing unit according to claim 1, wherein:

the chamber vessel has an inside cylinder for housing the substrate-holder and an outside cylinder surrounding the inside cylinder, and the gas-introducing slit and the gas-absorbing opening are formed in the inside cylinder.

3. A thermal processing unit according to claim 1, wherein:

the gas-introducing slit is formed along one part of a side wall of the chamber vessel, and the gas-absorbing opening is formed at another part of the side wall of the chamber vessel.

4. A thermal processing unit according to claim 1, wherein:

the gas-introducing slit includes a plurality of zone-slits which respectively correspond to a plurality of zones arranged in the direction in which the plurality of substrates are arranged.

5. A thermal processing unit according to claim 4, wherein:

the plurality of zone-slits are respectively connected to a plurality of flow-controllers which respectively correspond to the plurality of zones.

6. A thermal processing unit according to claim 4, wherein:

each of the plurality of zone-slits includes a plurality of slit-elements which respectively correspond to a plurality of peripheral areas of the plurality of substrates.

7. A thermal processing unit according to claim 5, wherein:

each of the plurality of zone-slits includes a plurality of slit-elements which respectively correspond to a plurality of peripheral areas of the plurality of substrates.

8. A thermal processing unit according to claim 1, wherein:

the gas-introducing slit includes a plurality of area-slits which respectively correspond to a plurality of peripheral areas of the plurality of substrates.

9. A thermal processing unit according to claim 1, wherein:

the substrate-holder has board-members coming in contact with portions of peripheries of the plurality of substrates, said board-members having arc sections and predetermined thicknesses extending from the portions of the peripheries of the plurality of substrates in a radial direction of the plurality of substrates respectively.

10. A thermal processing method comprising:

a step of supporting a plurality of substrates in such a manner that the plurality of substrates are arranged in a tier-like manner at regular intervals along a vertical direction, so as to be perpendicular to the vertical direction, and horizontal and in parallel with each other, and a step of supplying a processing gas for a thermal process from a gas-introducing slit to a a gas absorbing opening and causing the processing gas to pass between any neighboring two of the plurality of substrates, said gas-introducing slit having an introducing conductance provided in one part of a peripheral area that is peripheral to the plurality of substrates, and said gas-introducing slit extending in the vertical direction, said gas-absorbing opening having an absorbing conductance that is relatively larger than the introducing conductance, the gas absorbing opening being provided in another part of the peripheral area, and extending in the vertical direction.

11. A thermal processing method according to claim 10, wherein:

the gas-introducing slit includes a plurality of zone-slits which respectively correspond to a plurality of zones arranged in the direction in which the plurality of substrates are arranged.

12. A thermal processing method according to claim 11, wherein:

a volume of the processing gas for the thermal process supplied into each of the plurality of zone-slits is controlled independently.

13. A thermal processing method according to claim 12, wherein:

the volume of the processing gas for the thermal process supplied into each of the plurality of zone-slits is controlled in such a manner that the volume is larger when a zone-slit is nearer to a discharging opening connected to the gas-absorbing opening.

14. A film-forming processing method comprising:

a step of supporting a plurality of substrates in such a manner that the plurality of substrates are arranged in a tier-like manner at regular intervals in a vertical direction, so as to be perpendicular to the vertical direction, and horizontal and in parallel with each other, a step of supplying a processing gas for a film-forming process from a gas-introducing slit to a gas absorbing opening and causing the processing gas to pass between any neighboring two of the plurality of substrates, said gas-introducing slit having an introducing conductance provided in one part of a peripheral area that is peripheral to the plurality of substrates, and said gas-introducing slit extending in the vertical direction, said gas-absorbing opening having an absorbing conductance that is relatively larger than the introducing conductance, the gas absorbing opening being provided in another part of the peripheral area, and extending in the vertical direction.

15. A thermal processing method according to claim 14, wherein:

the gas-introducing slit includes a plurality of zone-slits which respectively correspond to a plurality of zones arranged in the direction in which the plurality of substrates are arranged.

16. A film-forming processing method according to claim 15, wherein:

a volume of the processing gas for the film-forming process supplied into each of the plurality of zone-slits is controlled independently.

17. A film-forming processing method according to claim 16, wherein:

the volume of the- processing gas for the film-forming process supplied into each of the plurality of zone-slits is controlled in such a manner that the volume is larger when a zone-slit is nearer to a discharging opening connected to the gas-absorbing opening.

* * * * *